(12) United States Patent
Tokuda et al.

(10) Patent No.: US 7,951,470 B2
(45) Date of Patent: May 31, 2011

(54) LIGHT EMITTING ELEMENT, LIGHT EMITTING DEVICE, AND LIGHTING SYSTEM

(75) Inventors: Atsushi Tokuda, Kanagawa (JP); Masakazu Egawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 536 days.

(21) Appl. No.: 11/632,593

(22) PCT Filed: Aug. 12, 2005

(86) PCT No.: PCT/JP2005/015109
§ 371 (c)(1),
(2), (4) Date: Jan. 16, 2007

(87) PCT Pub. No.: WO2006/022193
PCT Pub. Date: Mar. 2, 2006

(65) Prior Publication Data
US 2008/0036369 A1    Feb. 14, 2008

(30) Foreign Application Priority Data

Aug. 23, 2004  (JP) ................. 2004-242768

(51) Int. Cl.
*H01L 51/54* (2006.01)
(52) U.S. Cl. ......... 428/690; 428/917; 313/504; 313/506
(58) Field of Classification Search .............. None
See application file for complete search history.

(56) References Cited

U.S. PATENT DOCUMENTS 4,769,292 A * 9/1988 Tang et al. ............. 428/690
(Continued)

FOREIGN PATENT DOCUMENTS

JP    3-274695    12/1991
(Continued)

OTHER PUBLICATIONS

Machine translation for JP 2003-040873, published Feb. 2003.*
(Continued)

*Primary Examiner* — Dawn L Garrett
(74) *Attorney, Agent, or Firm* — Husch Blackwell LLP

(57) ABSTRACT

According to the present invention, a light-emitting element, a light-emitting device, and a lighting system, each of which has a broad spectrum like sunlight and has high color rendering properties, can be obtained. One embodiment of the present invention has a light-emitting device which includes at least two kinds of luminescence center materials, and at least one kind of the luminescence center materials is a quinoxaline derivative represented by the following general formula (1):

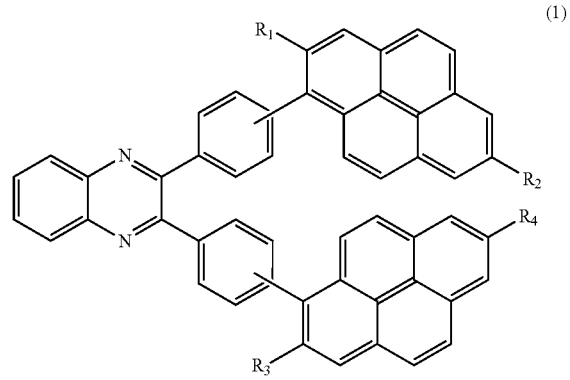

wherein R1 to R4 are individually hydrogen or an alkyl group having 4 carbon atoms (a straight-chain structure or a branch structure).

20 Claims, 10 Drawing Sheets

U.S. PATENT DOCUMENTS

| | | | |
|---|---|---|---|
| 5,989,737 A | 11/1999 | Xie et al. | |
| 6,717,358 B1* | 4/2004 | Liao et al. | 313/504 |
| 7,511,421 B2 | 3/2009 | Tsutsui et al. | |
| 2001/0046611 A1 | 11/2001 | Kido et al. | |
| 2002/0006039 A1* | 1/2002 | Ueda et al. | 362/217 |
| 2003/0189401 A1* | 10/2003 | Kido et al. | 313/504 |
| 2004/0140758 A1* | 7/2004 | Raychaudhuri et al. | 313/504 |
| 2005/0095356 A1* | 5/2005 | Nakamura et al. | 427/58 |
| 2006/0040132 A1* | 2/2006 | Liao et al. | 428/690 |
| 2006/0240277 A1* | 10/2006 | Hatwar et al. | 428/690 |
| 2007/0200125 A1 | 8/2007 | Ikeda et al. | |

FOREIGN PATENT DOCUMENTS

| | | |
|---|---|---|
| JP | 4-357694 | 12/1992 |
| JP | 07-142169 | 6/1995 |
| JP | 7-312289 | 11/1995 |
| JP | 2824411 | 11/1998 |
| JP | 2000-315580 | 11/2000 |
| JP | 2003-040873 | 2/2003 |
| JP | 2004-200162 | 7/2004 |
| JP | 2004-349007 | 12/2004 |
| JP | 2005-26121 | 1/2005 |
| WO | WO 2005/031798 A2 | 4/2005 |

OTHER PUBLICATIONS

International Search Report re application No. PCT/JP2005/015109, dated Nov. 15, 2005.

Written Opinion re application No. PCT/JP2005/015109, dated Nov. 15, 2005.

Tang, C.W. et al, "Organic Electroluminescent Diodes," Appl. Phys. Lett., vol. 51, No. 12, Sep. 21, 1987, pp. 913-915.

Tang, C.W. et al, "Electroluminescence of Doped Organic Thin Films," J. Appl. Phys., vol. 65, No. 9, May 1, 1989, pp. 3610-3616.

Tokito, S. et al, "Metal Oxides as a Hole-Injecting Layer for an Organic Electroluminescent Device," J. Phys. D: Appl. Phys. vol. 29, 1996, pp. 2750-2753.

Nakada, O.T. et al, "Multi Photon Emission Organic EL Devices Using Charge-Transfer Complex as Charge Generation Layer," The Japan Society of Applied Physics, the 63$^{rd}$ Autumn Meeting, Sep. 1, 2002, p. 1165 (with English translation).

* cited by examiner

LIGHT EMITTING ELEMENT, LIGHT EMITTING DEVICE, AND LIGHTING SYSTEM

TECHNICAL FIELD

The present invention relates to a light-emitting element, and more particularly such a light-emitting element, a light-emitting device, and a lighting system, each of which has color rendering properties.

BACKGROUND ART

A display using a self-luminous thin film light-emitting element which emits light by being applied with current has been actively developed.

These light-emitting elements emit light by connecting an electrode to a single thin layer or multiple thin layers made from either or both of an organic material and an inorganic material and by applying current to the electrode. Such the thin film light-emitting element is a promising element in terms of low power consumption, a small footprint, visibility, or the like, and it is expected to bring about expansion of markets.

In the case of a light-emitting element having a multiple layered structure, functions of the layer are divided, consequently, a light-emitting element which emits light more efficiently than the conventional light-emitting element can be manufactured (for example, refer to non-patent document 1: C. W. Tang et al., "Applied Physics Letters", Vol. 51, No. 12, pp. 913-915 (1987)).

A light-emitting element having a multiple layered structure is constructed by interposing a light emitting laminated body formed by a hole injecting layer, a hole transporting layer, a light-emitting layer, an electron transporting layer, an electron injecting layer, and the like between an anode and a cathode. Any of the hole injecting layer, the hole transporting layer, the electron transporting layer, and the electron injecting layer may not be used depending on an element configuration. The hole transporting layer and the electron transporting layer may serve as a light-emitting layer. In that case, a method for doping dye having high light emission efficiency to the electron transporting layer having a high carrier transporting property or the hole transporting layer is used. By using the method, a material which has high light emission efficiency but a low carrier transporting property can be used for forming the light-emitting layer (for example, refer to non-patent document 2: C. W. Tang et al., "Journal of Applied Physics", Vol. 65, No. 9, pp. 3710-3716, (1989)).

The thin film light-emitting element having the foregoing characteristics is expected to be used as a lighting system. In the case that the thin film light-emitting element is used as a lighting system, it is desired that the thin film light-emitting element emits white light emission. Therefore, it is attempted that a light-emitting element is made to include a plurality kinds of luminescence centers exhibiting different emission colors to obtain white light emission (for example, refer to patent document 1: Japanese Patent Application Laid-Open No. H7-142169).

White emission is recognized by stimulating uniformly pyramidal cells of human eyes. To manufacture a light-emitting element which emits light recognized as white emission, it is known that light-emitting materials exhibiting three colors of red, green, and blue, respectively, can be emitted simultaneously, or two kinds of light-emitting materials which exhibit two complementary colors of emission can be emitted simultaneously.

However, white emission formed in such a way has often a spectrum having projecting shapes of each color, and is inferior in color rendering properties to natural light which has the same intensity in all wavelength components.

That is, the color of an object is recognized by human eyes by absorbing or reflecting light at a specified wavelength band. However, in the case that light at a specified wavelength band has extremely high intensity or extremely low intensity, the color seems to change by being specified light enhanced or tamed compared to light having the same intensity in all wavelength components such as sunlight.

In view of the foregoing, it is desired that emission spectra of the light-emitting element, the light-emitting device, and the lighting system are broad such as sunlight. It is an object of the present invention to provide such the light-emitting element, light-emitting device, and lighting system, each of which has high color rendering properties.

DISCLOSURE OF INVENTION

One embodiment of the present invention is a light-emitting element having an organic compound layer between a pair of electrodes, the organic compound layer includes at least two kinds of luminescence center materials, and at least one kind of a plurality of the luminescence center materials is a quinoxaline derivative represented by the following general formula (1):

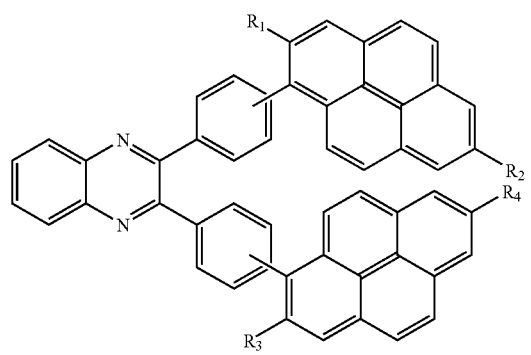

(1)

In the general formula (1), R1 to R4 are individually hydrogen or an alkyl group having 4 carbon atoms (a straight-chain structure or a branch structure).

One embodiment of the present invention is a light-emitting element having an organic compound layer between a pair of electrodes, the organic compound layer includes at least two kinds of luminescence center materials, and at least one kind of a plurality of the luminescence center materials is a quinoxaline derivative represented by the following general formula (2):

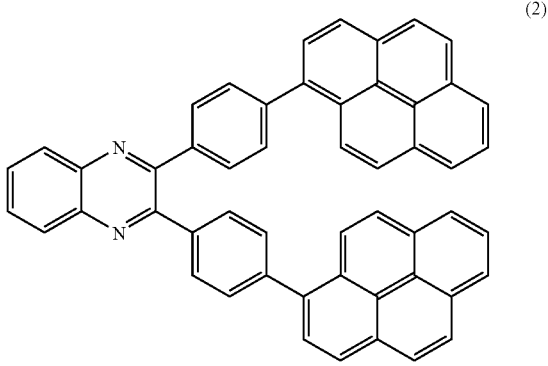

(2)

One embodiment of the present invention is a light-emitting element having an organic compound layer between a pair of electrodes, the organic compound layer includes at least two kinds of luminescence center materials, and at least one kind of a plurality of the luminescence center materials is a quinoxaline derivative represented by the following general formula (3):

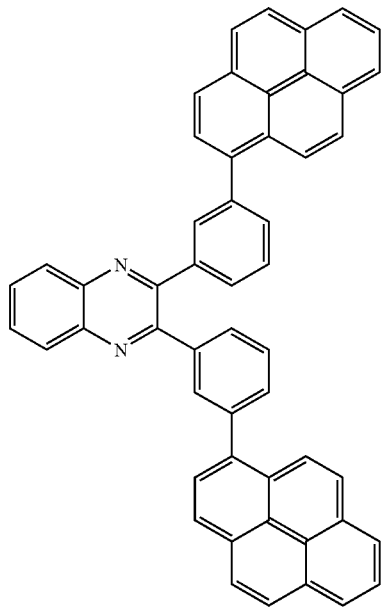

(3)

One embodiment of the present invention is a light-emitting element having an organic compound layer between a pair of electrodes, the organic compound layer includes at least two kinds of luminescence center materials, and at least one kind of a plurality of the luminescence center materials is a quinoxaline derivative represented by the following general formula (4):

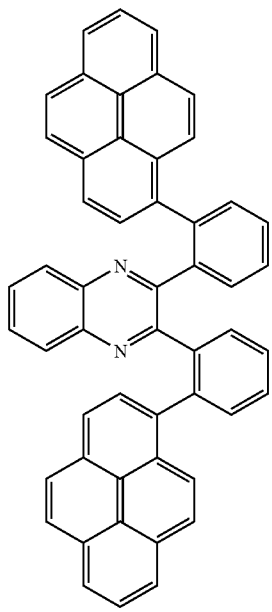

(4)

One embodiment of the present invention is a light-emitting element having an organic compound layer between a pair of electrodes, the organic compound layer includes at least two kinds of luminescence center materials, and at least one kind of a plurality of the luminescence center materials is a quinoxaline derivative represented by the following general formula (5):

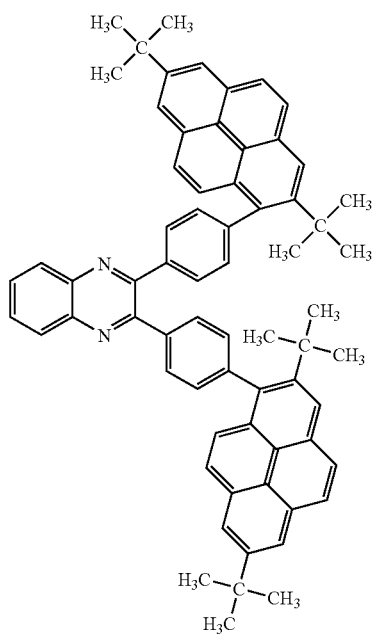

(5)

One embodiment of the present invention is a light-emitting element having an organic compound layer between a pair of electrodes, the organic compound layer includes at least two kinds of luminescence center materials, and at least one kind of a plurality of the luminescence center materials is a quinoxaline derivative represented by the following general formula (6):

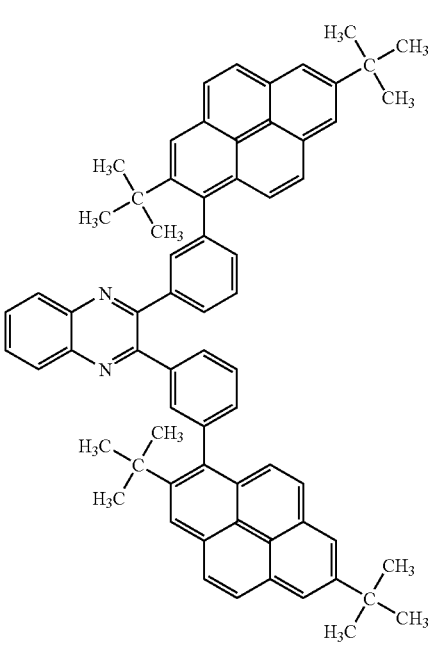

(6)

One embodiment of the present invention is a light-emitting element having an 10 organic compound layer between a pair of electrodes, the organic compound layer includes at least two kinds of luminescence center materials, and at least one kind of a plurality of the luminescence center materials is a quinoxaline derivative represented by the following general formula (7):

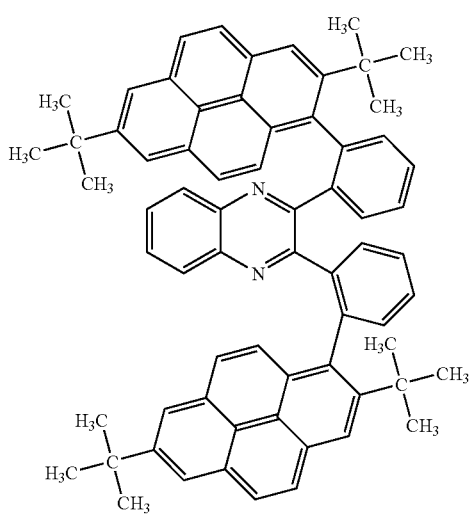

(7)

One embodiment of the present invention is a light-emitting device having the foregoing light-emitting element between a pair of substrates.

Since the light-emitting element includes a quinoxaline derivative having an extremely broad spectrum represented by the foregoing general formula (1), the light spectrum of the light-emitting element can be easily made close to the spectrum of sunlight according to the present invention.

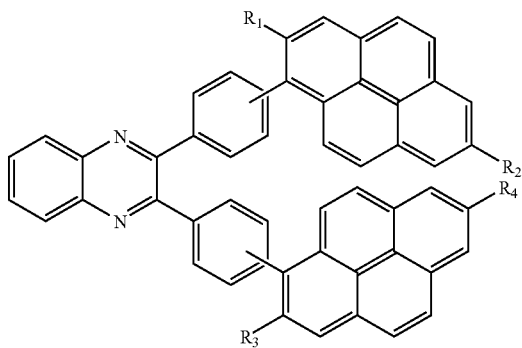

(1)

Further, a light-emitting device and a lighting system having high color rendering properties can be obtained according to the present invention.

The above and further objects and novel features of the invention will more fully appear from the following details description when the same is read in connection with the accompanying drawings. As the present invention may be embodied in several forms, it is to be understood that various changes and modifications will be apparent to those skilled in the art without departing from the spirit of essential characteristics of the present invention. Therefore, unless otherwise such changes and modifications depart from the scope of the present invention hereinafter described, they should be construed as being included therein.

BEST MODE FOR CARRYING OUT THE INVENTION

Embodiment 1

Figure 1:
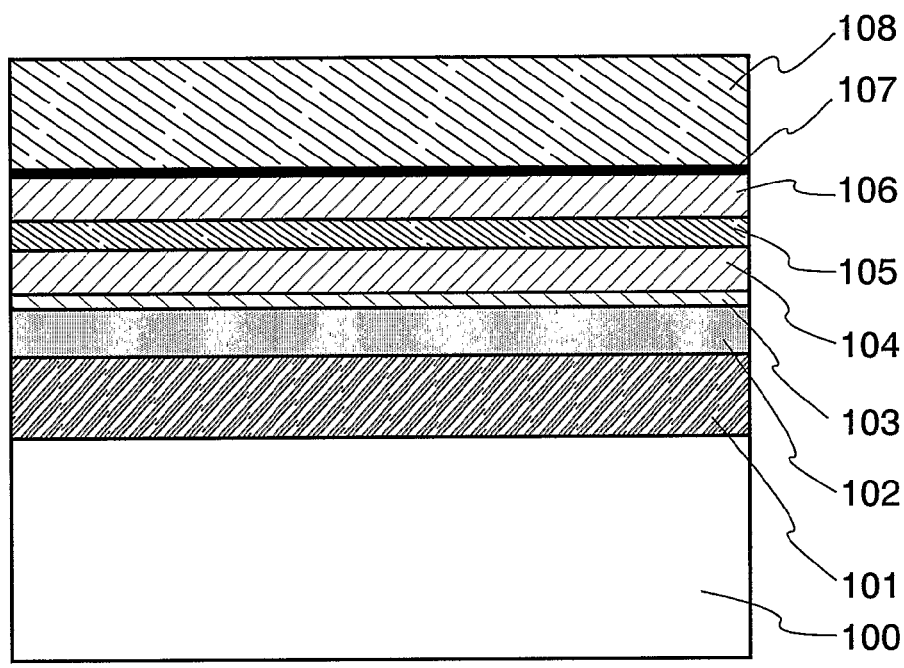
FIG. 1 is a view for showing an example of a light-emitting element according to the present invention (Embodiment 1)

The following formula (1) shows a general formula of a compound which is used in a light-emitting element according to the present invention as one of luminescent center materials.

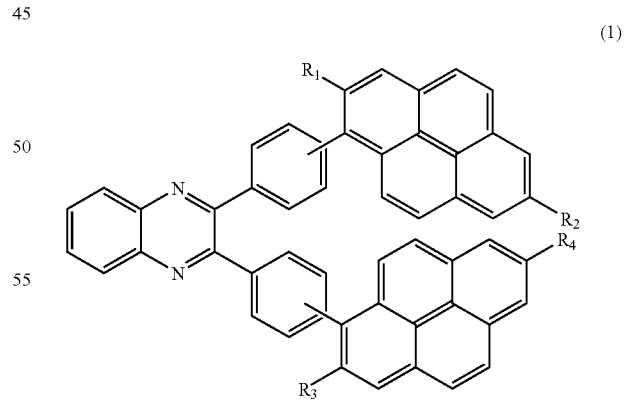

(1)

It is to be noted that R1 to R4 are hydrogen or an alkyl group (a straight-chain structure or a branch structure) having 4 carbon atoms in the general formula (1).

Next, specific examples of quinoxaline derivative represented by the general formula (1) are cited by following formulas (2) to (7).

(2)
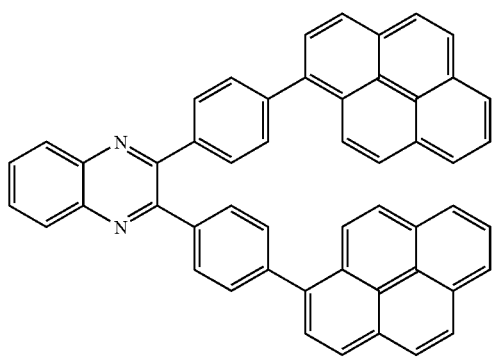
(3)
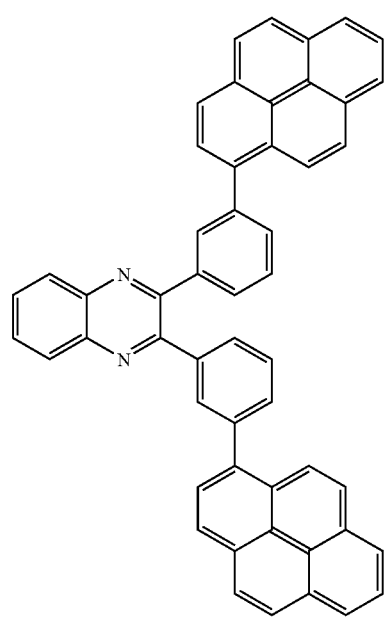
(4)
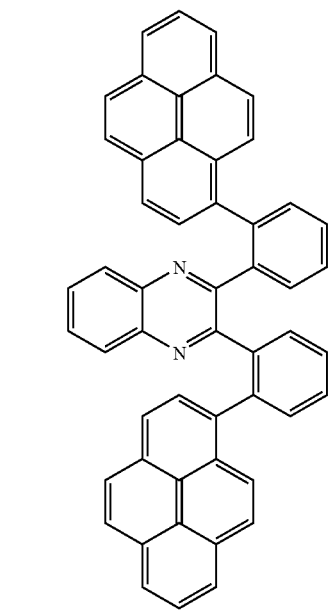
(5)
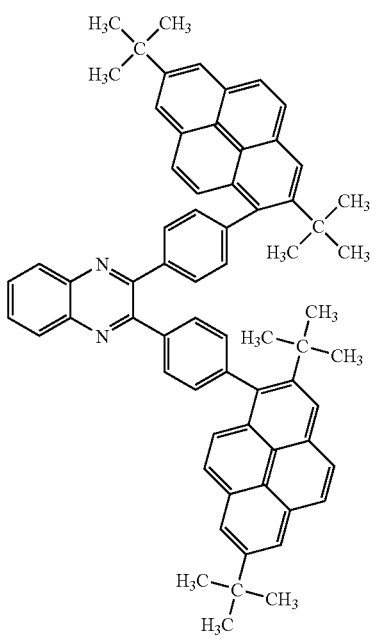
(6)
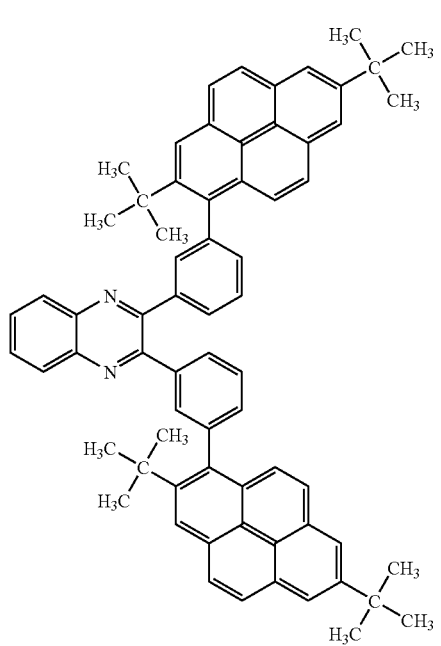

-continued

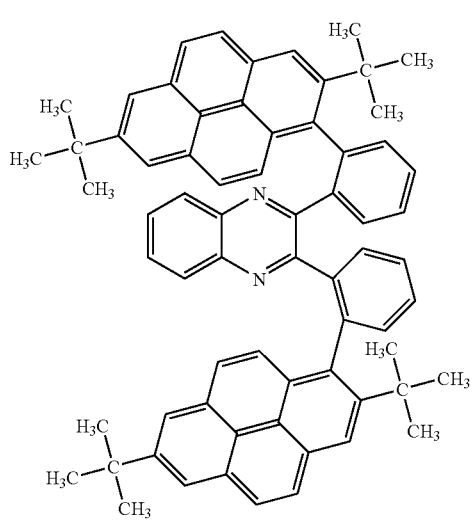
(7)

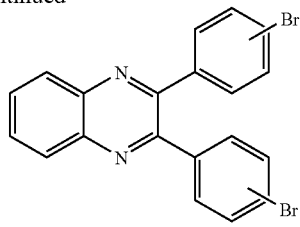

Subsequently, the quinoxaline derivative synthesized in accordance with the reaction scheme (9) is made to be a boronic acid (the reaction scheme (9)).

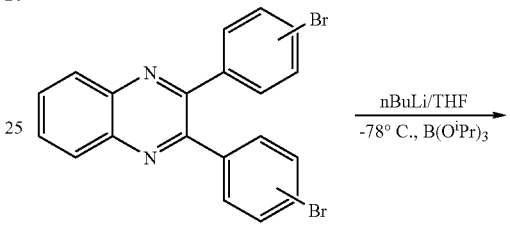
(9)

Subsequently, a method of synthesizing the quinoxaline derivative of the formula (1) will be described. It is possible to synthesize the quinoxaline represented by the general formula in accordance with the following synthesis schemes (8) to (10).

First, a quinoxaline ring is formed by dehydrative condensation reaction phenylendiamine with 2,3-bis(bromophenyl) 1,2-dion (the reaction scheme (8)).

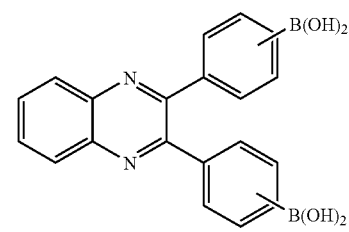

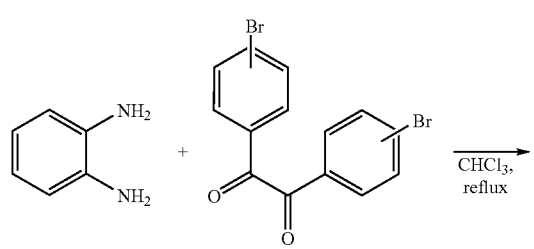
(8)

Finally, a quinoxaline derivative represented by the formula (1) can be synthesized by coupling the boronic acid synthesized in accordance with the reaction scheme (9) and an aryl halide with a palladium catalyst.

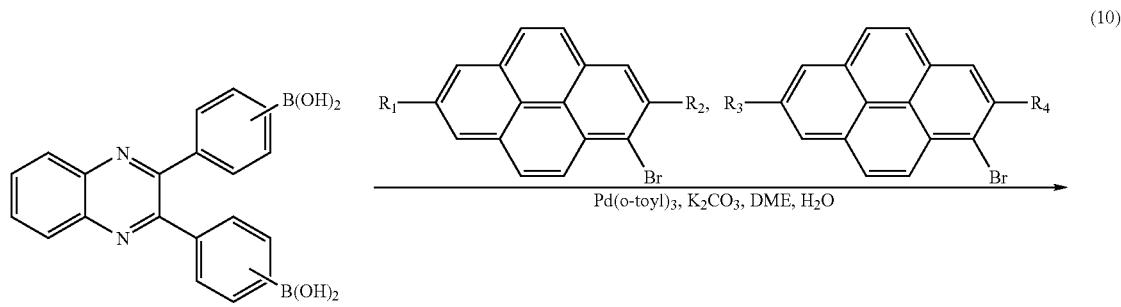
(10)

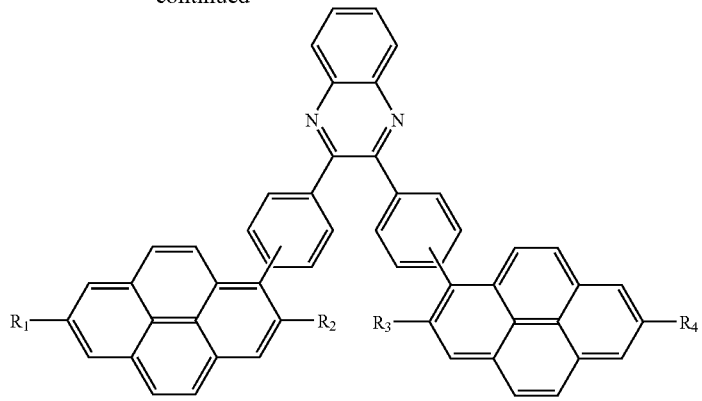

It is to be noted that a difference among the general formulas (2), (3) and (4) (or among the general formulas (5), (6) and (7)) is a difference in location where pyrenyl groups are substituted. In the synthesis scheme (8), 2-bis-(4-bromo-phenyl)-ethane-1,2-dione (the following formula (11)) in the case of obtaining the quinoxaline derivative of the general formula (1) or (5), 2-bis-(2-bromo-phenyl)-ethane-1,2-dione (the following formula (12)) in the case of obtaining the quinoxaline derivative of the general formula (2) or (6), and 2-bis-(2-bromo-phenyl)-ethane-1,2-dione (the following formula (13)) in the case of obtaining the quinoxaline derivative oh the general formula (3) or (7) may be used as a material which is reacted with phenylendiamine to synthesize the quinoxaline derivative.

In addition, a difference between the general formulas (2) to (4) and (5) to (7) is that t-butyl groups are introduced to R1 to R4 of the pyrenyl groups. In this case, in the reaction scheme (10), R1 to R4 are hydrogen when the quinoxalune derivatives represented by the general formulas (2) to (4) are synthesized, and R1 to R4 are t-butyl groups when the quinoxaline derivatives represented by the general formulas (5) to (7) are synthesized. Further, R1 to R4 may be n-butyl groups although not mentioned as an example in the formulas.

It is to be noted that 2,7-di-tert-butyl-1-bromopyrene which is used to synthesize a quinozaline derivative in which t-butyl groups are introduced to R1 to R4 can in accordance with synthesized by the following reaction scheme (14).

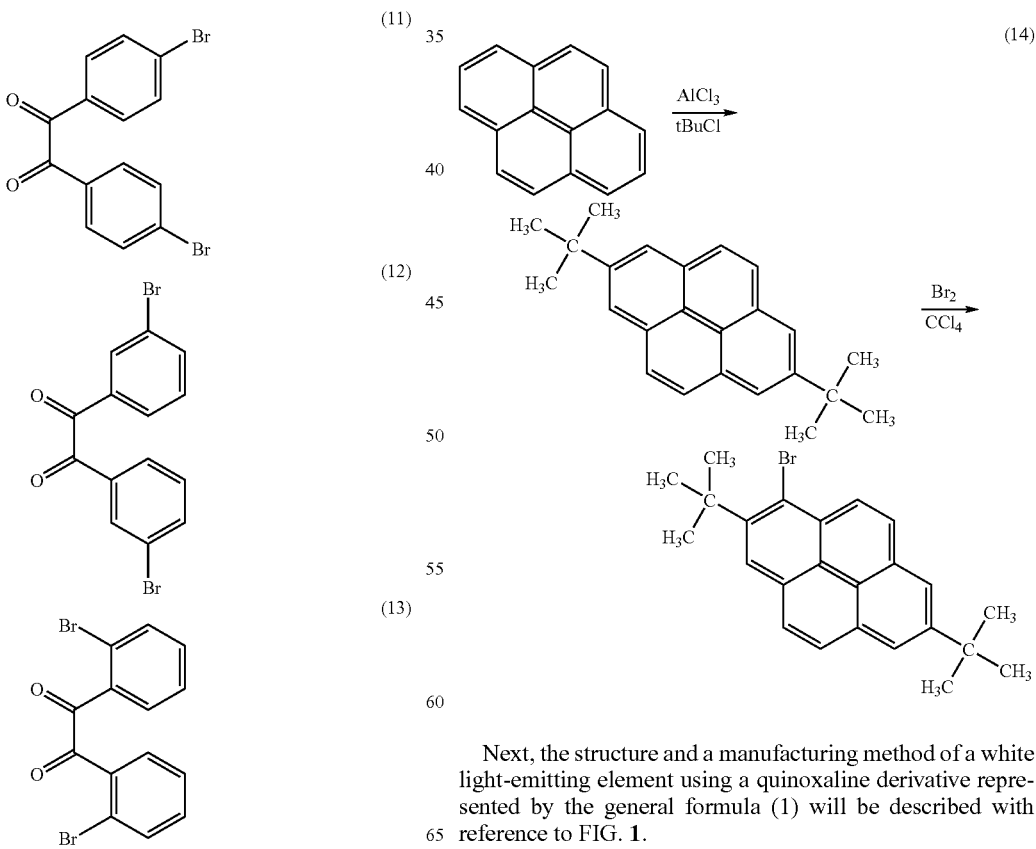

Next, the structure and a manufacturing method of a white light-emitting element using a quinoxaline derivative represented by the general formula (1) will be described with reference to FIG. 1.

It is to be noted that, in the description, the luminescent center material indicates a material that produces luminescence actually when a current is applied between a pair of electrodes which a light-emitting element has.

A white light-emitting element according to the present invention has, over a substrate 100 which has an insulating surface, a layer including an organic compound between a pair of electrodes of a first electrode 101 and a second electrode 108. The layer including the organic compound formed by stacking a first carrier injecting layer 102, a first carrier transporting layer 103, a first light-emitting layer 104, a second light-emitting layer 105, a second carrier transporting layer 106, and a second carrier injecting layer 107.

One of the light-emitting layer 104 and the light-emitting layer 105 is a layer composed of a single film of a quinoxaline derivative represented by the general formula (1). The other light-emitting layer may be a layer in which a material which emits light that has a spectrum peak in the range of 580 to 750 nm referred to as red from the luminescent center, for example, 4-dicyanomethlyen-2-methyl-6-(p-dimethylamino-styryl)-4H-pyran (abbreviated as DCM1), 4-(dicyanomethylen)-2-methyl-6-[2(julolidin-9-yl)ethenyl]-4H-pyran (abbreviated as DCM2), 4-(dicyanomethylen)-2-methyl-6-(1,1,7,7-tetramethyljulolidyl-9-enyl)-4H-pyran (abbreviated as DCJT) 4-dicyanomethylen-2-t-butyl-6-(1,1,7,7-tetramethyljulolidyl-9-enyl)-4H-pyran, or bis[2-(2'-benzothienyl)pryidinato-N,C$^{3'}$]-(acethylacetonate)iridium (abbreviated as Ir(btp)$_2$(acac)), into a parent material which has larger energy gap than the material and is comparatively excellent in a carrier transporting property (for example, 4,4'-bis[N-(1-napthyl)-N-phenyl-amino]-biphenyl (abbreviated as α-NPD), or tris(8-quinolinato) aluminum (abbreviated as Alq3). Alternatively, the other layer may be a single film of luminescent material that produces red luminescence.

The first electrode 101 and the second electrode 108 are made a pair. One of the first electrode 101 and the second electrode 108 serves as an anode, and the other electrode serves as a cathode. Further, a first carrier and a second carrier correspond to the first electrode 101 and the second electrode 108, respectively. Carriers are holes when a corresponding electrode is an anode, while carriers are electrons when a corresponding electrode is a cathode. Namely, when the first electrode 101 is an anode, the second electrode 108 is a cathode, the first carrier is a hole, and the second carrier is an electron.

It is to be noted that the first carrier injecting layer 102, the first carrier transporting layer 103, the second carrier transporting layer 106 and the second carrier injecting layer 107 are no matter to be provided or not to be provided. It is easy for those in the art to choose the layers appropriately according to the necessity. In addition, a layer which has a function such as a hole blocking layer may be added appropriately.

Glass, quartz, and plastics (polyimide, acryl polyethyleneterephthalate, polycarbonate, polyacrylate, polyethersulfone and the like) can be used for the substrate 100.

As an anode material, it is preferable to use a metal, an alloy, an electrically conductive compound, a mixture thereof, or the like which has a larger work function (a work function of 4.0 eV or more). As specific examples of the anode material, gold (Au), platinum (Pt), nickel (Ni), tungsten (W), chromium (Cr), molybdenum (Mo), iron (Fe), cobalt (Co), copper (Cu), palladium (Pd), and a nitride of a metal material (TiN), and the like can be used in addition to ITO (indium tin oxide), ITSO (indium tin silicon oxide), and IZO (indium zinic oxide) of indium oxide mixed with 2 to 20% zinc oxide (ZnO).

As a cathode material, it is preferable to use a metal, an alloy an electrically conductive compound, a mixture thereof, or the like which has a smaller work function (a work function of 3.8 eV or less). As specific examples of the cathode material, in addition to elements belonging to Group 1 or 2 of the periodic table of the elements, that is, alkali metals such as Li and Cs and alkali-earth metals such as Mg, Ca, and Sr, and alloys (Mg:Ag and Al:Li) and compounds (LiF, CsF, and CaF$_2$) including these, a transition metal including a rare-earth metal can be used to form a cathode. The cathode can be formed also by using a lamination layer of the cathode material and a metal (including an alloy) such as Al, Ag, or ITO.

As a material that can be used for a hole injecting layer, it is preferable to use a material which can accept holes from an anode. It is preferable to form the hole injecting layer with the use a material that is capable of injecting holes into a layer which is in contact with the hole injecting layer and is provided to be nearer to in a cathode than the hole injecting layer. For example, an aromatic amine compound such as phthalocyanine (abbreviated as H$_2$-Pc), copper phthalocyanine (abbreviated as Cu-Pc), 4,4'-bis[N-(4-(N,N-di-m-tolylamino)phenyl)-N-phenylamino]biphenyl (abbreviated as DNTPD), or 4,4',4''-tris[N-(3-methylphenyl)-N-phenylamino]-triphenylamine (abbreviated as MTDATA) can be used. In addition, a conductive inorganic compound (including a semiconductor) such as molybdenum oxide (MoOx) or vanadium oxide (VOx) can be used. Furthermore, a mixture of the conductive inorganic compound and an aromatic amine compound as mentioned above or below can be used. The mixture can be formed by a method such as co-evaporation.

As a material that can be used for a hole transporting layer, it is preferable to use an aromatic amine compound (that is, a compound having a benzene ring-nitrogen bond). For example, in addition to 4,4'-bis[N-(3-methylphenyl-amino)-N-phenyl-amino]-biphenyl (abbreviated as TPD) and 4,4'-bis[N-(1-napthyl)-N-phenyl-amino]-biphenyl (abbreviated as α-NPD), it is preferable to form the hole transporting layer with the use of a starburst aromatic amine compound such as the above-mentioned MTDATA or 4,4',4''-tris(N,N-diphenyl-amino)-triphenylamine (abbreviated as TDATA). In addition, a mixture of a conductive inorganic compound (including a semiconductor) such as molybdenum oxide or vanadium oxide and the aromatic amine compound as mentioned above can be used. This mixture can be formed by a method such as co-evaporation.

Materials that can be used for an electron injecting layer include a compound of an alkali metal or an alkali-earth metal such as lithium fluoride (LiF), cesium fluoride (CsF), calcium fluoride (CaF$_2$). Furthermore, in addition to this, a mixture of a highly electron transporting material such as tris(8-quinolinalato)aluminum (abbreviated as Alq$_3$) and an alkali-earth material such as magnesium (Mg) may be used.

As a material that can be used for an electron transporting layer, it is preferable to use a material which is capable of transporting electrons, which are injected from the side of an electrode serving as a cathode to a layer including a luminescent material, toward a light-emitting layer. In addition, it is preferable to form the electron transporting layer with the use of a material which has larger ionization potential than a material forming the light-emitting layer. However, in the case of providing a hole blocking layer between the light-emitting layer and the electron transporting layer, it is not always necessary to use a material which has larger ionization potential than a material forming the light-emitting layer.

Specific examples of this electron transporting material include a metal complex including a quinoline skeleton or a benzoquinoline skeleton, such as Alq3, bis(2-methyl-8-quinolinolato)-4-phenylphenolato-aluminum (abbreviated as BAlq), tris(8-quinolinolato)gallium (abbreviated as Gaq$_3$), tris(4-methyl-8-quinolonolato)aluminum (abbreviated as Almq3), and bis(10-hydroxybenzo[h]-quinolinolato)beryllium (abbreviated as BeBq$_2$). In addition, a metal complex including an oxazole or thiazole ligand such as bis[2-(2-hydroxyphenyl)-benzoxazolato]zinc (abbreviated as Zn(Box)$_2$), bis[2-(2-hydroxyphenyl)-benzothiazolato]zinc (abbreviated as Zn(BTZ)$_2$) can be used as a material for forming the electron transporting layer. Further, an inorganic material such as titanium oxide can be used in addition to 2-(4-biphenyl)-5-(4-tert-butylphenyl)-1,3,4-oxadiazole (abbreviated as PBD), 1,3-bis[5-(p-tert-butylphenyl)-1,3,4-oxadiazole-2-yl]benzene (abbreviated as OXD-7), 3-(4-tert-butylphenyl)-4-phenyl-5-(4-biphenylyl)-1,2,4-triazole (abbreviated as TAZ), 3-(4-tert-butylphenyl)-4-(4-ethylphenyl)-5-(4-biphenylyl)-1,2,4-triazole (abbreviated as p-EtTAZ), bathophenanthroline (abbreviated as BPhen), and bathocuproin (abbreviated as BCP).

An example of a light-emitting element which has such a structure according to the present invention will be given below. It is to be noted that the structure is one example, and the present invention is not limited to this.

A specific structure of the white light-emitting element according to the present invention in the present embodiment mode will be described below. On the glass substrate 100, an ITO is laminated by sputtering to be 110 nm as the first electrode 101 (anode). Subsequently, 50 nm of DNTPD as the first carrier injecting layer 102 (hole injecting layer); 10 nm of α-NPD as the first carrier transporting layer 103 (hole transporting layer); 30 nm of a red light-emitting layer as the first light-emitting layer 104; 20 nm of a quinoxaline derivative represented by the general formula (1) as the second light-emitting layer 105; 30 nm of an Alq as the second carrier transporting layer 106 (electron transporting layer); 1 nm of CaF$_2$ as the carrier injecting layer 107 (electron injecting layer); and 150 nm of aluminum as the second electrode 108 (cathode) are formed by evaporation.

It is to be noted that the first light-emitting layer 104 may be formed by co-evaporation to include 4-(dicyanomethylen)-2-methyl-6-[2-(julolidin-9-yl)ethenyl]-4H-pyran (abbreviated as DCM2) to serve as a luminescent center in α-NPD at 1 wt %. In addition, of course, the first light-emitting layer 104 may be another red light-emitting layer, and α-NPD may be another material. In this case, a material which has a larger band gap than the material to serve as a luminescent center is chosen for the material which is co-evaporated together with the material to serve as a luminescent center. Further, the first light-emitting layer 104 may be a layer composed of a sole red-luminescent material. In the second light-emitting layer 105, the quinoxaline derivative itself represented by the general formula (1) is a luminescent center. However, the second light-emitting element 105 may be formed by co-evaporation of a suitable material and the quinoxaline derivative.

When voltage is applied to the light-emitting element which has the above-described structure according to the present invention, holes are injected from the first electrode 101 into the first carrier injecting layer 102. Then, the holes injected from the electrode are transported by the first carrier transporting layer 103, and are injected into the first light-emitting layer 104. On the other hand, electrons are injected from the second electrode 108 into the second carrier injecting layer 107. The electrons injected from the electrode are transported by the second carrier transporting layer 106, and are injected into the second light-emitting layer 105. The injected holes and electrons are recombined in the light-emitting layer, and luminescence can be obtained when a luminescent material in an excited state returns to the ground state. Since the light-emitting element in the present embodiment has a certain level of luminescence intensity in almost all wavebands of visible light, a white light-emitting element which is capable of obtaining luminescence that is much closer to natural light can be manufactured. In addition, a light-emitting device and a lighting apparatus which are manufactured by using the light-emitting element according to the present invention can be a lighting device that has a high color rendering property.

Embodiment 2

Figure 2:
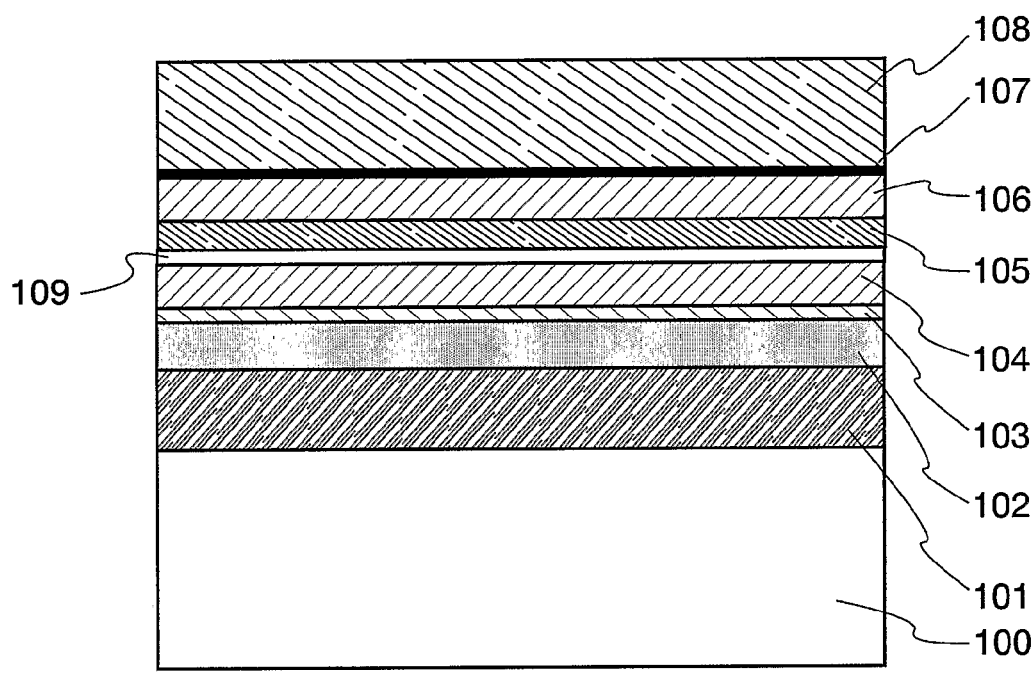
FIG. 2 is a view for showing an example of a light-emitting element according to the present invention (Embodiment 2)

In the present embodiment, a mode of providing a separation layer 109 between the light-emitting layer 104 and the light-emitting layer 105 in Embodiment 1 will be described with reference to FIG. 2. It is to be noted that the same references are assigned to about the same components those of as Embodiment 1, and descriptions thereof are omitted. Please refer to the corresponding descriptions in Embodiment 1.

In the present embodiment, providing the separation layer 109 is a different point from Embodiment 1. When luminescent materials which have different energy gaps are formed in contact with each other, energy transfer occurs between the luminescent materials. There is a possibility a phenomenon that only a luminescent color from one of the luminescent materials is emitted strongly and a luminescent color from the other is emitted weakly. In addition, when a material to serve as a parent material for the light-emitting element is a luminescent material, this parent material may produce luminescence depending on the energy gap. The separation layer 109 may be provided between light-emitting regions to improve this imbalance between the luminescent colors. It is necessary that the separation layer 109 have a light-transmitting property. The separation layer 109 may be composed of an electron transporting material or a hole transporting material. Specifically, the electron transporting material or the hole transporting material mentioned in Embodiment 1 may be used.

A specific structure of the white light-emitting element according to the present invention in the present embodiment will be described below. On a glass substrate 100, an ITO is laminated by sputtering to be 110 nm as a first electrode 101 (anode). Subsequently, 50 nm of DNTPD as the first carrier injecting layer 102 (hole injecting layer); 10 nm of α-NPD as the first carrier transporting layer 103 (hole transporting layer); 30 nm of a red light-emitting layer as the first light-emitting layer 104; 5 nm of BAlq as the separation layer 109; 25 nm of a quinoxaline derivative represented by the general formula (1) as the second light-emitting layer 105; 30 nm of an Alq as the second carrier transporting layer 106 (electron transporting layer); 1 nm of CaF$_2$ as the carrier injecting layer 107 (electron injecting layer); and 150 nm of aluminum as the second electrode 108 (cathode) are formed by evaporation.

It is to be noted that the first light-emitting layer 104 may be formed by co-evaporation to include 4,4'-bis(N-carbazolyl)-biphenyl (abbreviated as CBP) to serve as luminescent center in Ir(btp)$_2$(acac) at 8 wt %. In addition, of course, the first light-emitting layer 104 may be another red light-emitting layer, and CBP may be another material. In this case, a material which has a longer band gap than that is chosen for the material which is co-evaporated together with. Further, the first light-emitting layer 104 may be a layer composed of a sole red-luminescent material. In the second light-emitting layer 105, the quinoxaline derivative itself represented by the general formula (1) is a luminescent center. However, the second light-emitting element 105 may be formed by co-evaporation of a suitable material and the quinoxaline derivative concerned.

Since the light-emitting element in the present embodiment has a certain level of luminescence intensity in almost all wavebands of visible light, a white light-emitting element which is capable of obtaining luminescence that is much closer to natural light can be manufactured. In addition, a light-emitting device and a lighting apparatus which are manufactured by using the light-emitting element according to the present invention can be a lighting device which has a high color rendering property.

Embodiment 3

Figure 3:
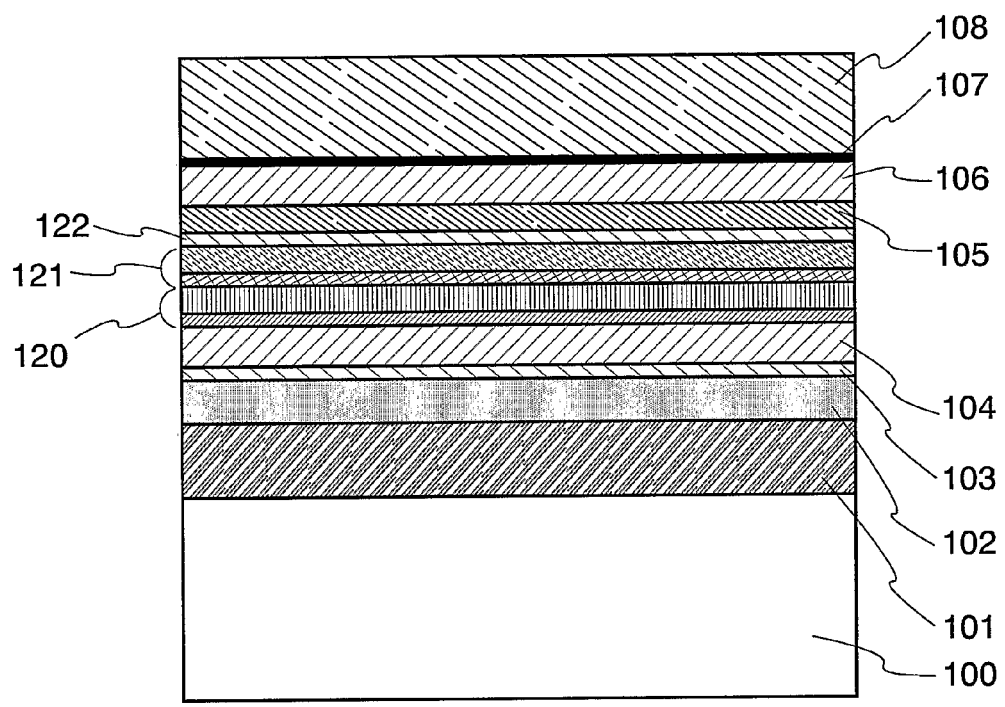
FIG. 3 is a view for showing an example of a light-emitting element according to the present invention (Embodiment 3)

In the present embodiment, the structure of a white light-emitting element using a phosphorescent material according to the present invention which is different from Embodiment 1 will be described with reference to FIG. 3. It is to be noted that the same references are assigned to the same components as those of Embodiment 1, and descriptions thereof may be omitted. Please refer to the corresponding descriptions in Embodiment 1.

The specific structure of a white light-emitting element according to the present invention in the present embodiment mode will be described below. On a glass substrate 100, an ITO is laminated by sputtering to be 110 nm as a first electrode 101 (anode). Subsequently, 50 nm of DNTPD as the first carrier injecting layer 102 (hole injecting layer); 10 nm of α-NPD as the first carrier transporting layer 103 (hole transporting layer); 30 nm of a red light-emitting layer as the first light-emitting layer 104; third carrier transporting layer 120; carrier generating layer 121; fourth carrier transporting layer 122; 40 nm of a quinoxaline derivative represented by the general formula (1) as the second light-emitting layer 105; 30 nm of an Alq as the second carrier transporting layer 106 (electron transporting layer); 1 nm of $CaF_2$ as the carrier injecting layer 107 (electron injecting layer); and 150 nm of aluminum as the second electrode 108 (cathode) are formed by evaporation.

Third carriers and fourth carriers have attributes opposite to first carriers and second carriers respectively. In the present embodiment, since the first carriers are holes and the second carriers are electrons, the third carriers are electrons and the fourth carriers are holes. In addition, the third carrier transporting layer 120 and the fourth carrier transporting layer 122 may be either a single layer or a multilayer. In the present embodiment, the third carrier transporting layer 120 is formed as a multilayer of BCP 10 nm and Alq 20 nm, and the fourth carrier transporting layer 122 is formed by depositing α-NPD to be 10 nm.

In addition, the carrier generating layer 121 may be either a single layer or a multilayer. In the case of forming a multilayer, a third carrier generating layer is formed to come in contact with the third carrier transporting layer 120, and a fourth carrier generating layer is formed to come in contact with the fourth carrier transporting layer 122. In the present embodiment, the carrier generating layer 121 is formed by two layers, by laminating a 10 nm film in contact with the third carrier transporting layer 120 and a 20 nm film in contact with the fourth carrier transporting layer 122, where the 10 nm film is formed by co-evaporation of Alq and Li so that the mole ratio of Alq to Li is 1:1, and the 20 nm film is formed by co-evaporation of α-NPD and MoOx so that the mole ratio of α-NPD to MoOx is 1:1.

Further, as a carrier generating layer, transparent conductive films can be used. Specifically, the transparent conductive films include indium tin oxide (abbreviated as ITO) indium tin oxide containing silicon, indium oxide including 2 to 20% zinc oxide, and the like. Further, such as a transparent conductive film may be provided between the third carrier generating layer and the fourth carrier generating layer.

It is to be noted that the first light-emitting layer 104 may be formed by co-evaporation to include 4,4'-bis(N-carbazolyl)-biphenyl (abbreviated as CBP) to serve as a luminescent center in $Ir(btp)_2(acac)$ at 8 wt %. In addition, of course, the first light-emitting layer 104 may be another red light-emitting layer, and CBP may be another material. In this case, a material which has a longer band gap than the material to serve as a luminescent center is chosen for the material which is co-evaporated together with the material to serve as a luminescent center. Further, the first light-emitting layer 104 may be a layer composed of a sole red-luminescent material. In the second light-emitting layer 105, the quinoxaline derivative itself represented by the general formula (1) is a luminescent center. However, the second light-emitting element 105 may be formed by co-evaporation of a suitable material and the quinoxaline derivative.

As the light-emitting element according to the present invention in the present embodiment, when a current is applied, carriers are injected from the first electrode 101 and the second electrode 102, and carriers are generated from the carrier generating layer 121. The first carriers and the third carriers, and the second carriers and the fourth carriers are recombined respectively in the first light-emitting layer and in the second light-emitting layer, and the luminescent material in each layer is excited. When the excited luminescent materials return to a ground state, luminescence is produced.

Since the light-emitting element in the present embodiment has a certain level of luminescence intensity in almost all wavebands of visible light, a white light-emitting element which is capable of obtaining luminescence that is much closer to natural light can be manufactured. In addition, a light-emitting device and a lighting apparatus which are produced by using the light-emitting element according to the present invention can be a lighting device which has a high color rendering property.

Embodiment 4

Figure 4:
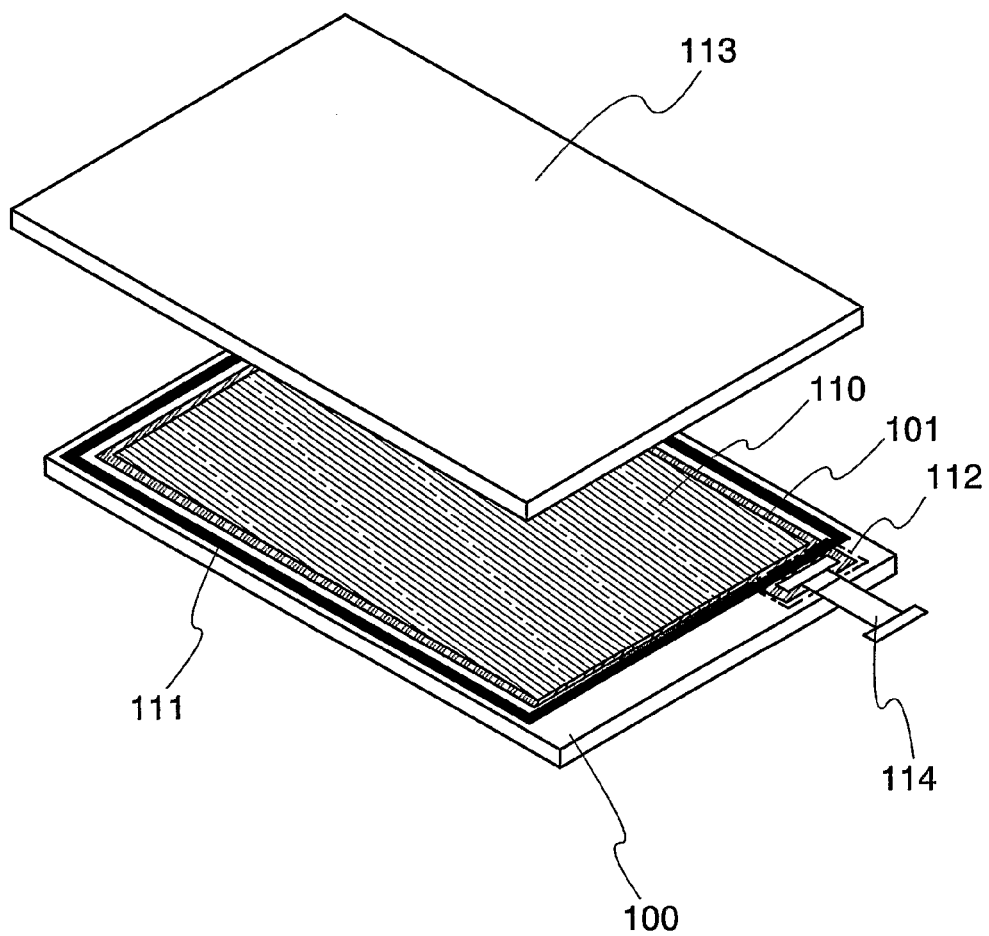
FIG. 4 is a view for showing an example of a light-emitting element according to the present invention (Embodiment 4)

Next, one example of a light-emitting device according to the present invention will be described with reference to FIG. 4. In the case of manufacturing a light-emitting element, sealing is performed in order to protect a light-emitting element from substances such as water which promote deterioration. In FIG. 4, reference numbers 100 denotes a substrate, 110 denotes first electrode, and 110 denotes a laminated body of a first carrier injecting layer to a second electrode, respectively. A light-emitting element including the first electrode 101 and the laminated body 110 is a light-emitting element which has one of the structures of Embodiment 1 to 3.

In the case of using an opposed substrate 113 for sealing, an insulating sealing material 111 is provided on the substrate 100 at the outer side of the light-emitting element so that an external connection portion 112 is exposed, and the opposed substrate 113 is bonded. The space between the opposed substrate 113 and the substrate 100 may be filled with inert gas such as dry nitrogen, or the sealing material 111 may be applied on the whole surface of a pixel portion to bond the opposed substrate. It is preferable to use ultraviolet curing resin as the sealing material. In the sealing material, a desiccant or particles for keeping the gap between the substrates constant may be mixed. Subsequently, a wiring 114 such as a conductive film or a flexible wiring board is attached to the external connection portion 112 to complete a light-emitting.

Since the light-emitting device which has such a structure according to the present invention has a certain level of luminescence intensity among almost all wave bands of visible light, luminescence which is much closer to natural light can be obtained. Therefore, the light-emitting device will be possible to be a high color rendering property lighting device.

It is to be noted that this light-emitting device may be used for a backlight of a liquid crystal display.

It is to be noted that the structure of a light-emitting device is not to be considered limited to the structure in the present embodiment.

Embodiment 5

In this embodiment, a lighting system according to the present invention is explained with reference to FIGS. 5A to 5C. The lighting system according to this embodiment is mounted with the light-emitting element as described in Embodiments 1 to 3 or the light-emitting device as described in Embodiment 4.

Figure 5A:
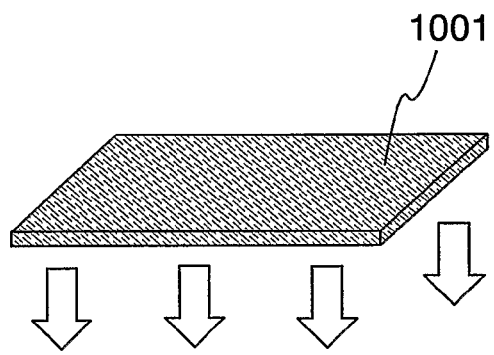
FIGS. 5A to 5C are views for showing an example of a lighting system according to the present invention (Embodiment 5)

FIG. 5A shows a lighting system which uses the light-emitting device according to the present invention as indoor lighting 1001. According to the present invention, the lighting system which can has excellent color rendering properties can be obtained since the lighting system can easily obtain light having sufficient light intensity in most wavelength ranges of visible light. Further, the lighting system according to the present invention can be a plane emission lighting system, for example, which can be placed allover the ceiling. The lighting system can be placed at not only a ceiling but also a wall, a floor, a pillar, or the like. Moreover, the lighting system according to the present invention can be made to have flexibility by being manufactured over a flexible substrate to be installed over a curved face. The lighting system can be used not only in the rooms but also outside the rooms and can be placed at the wall of a building as outdoor light.

Figure 5B:
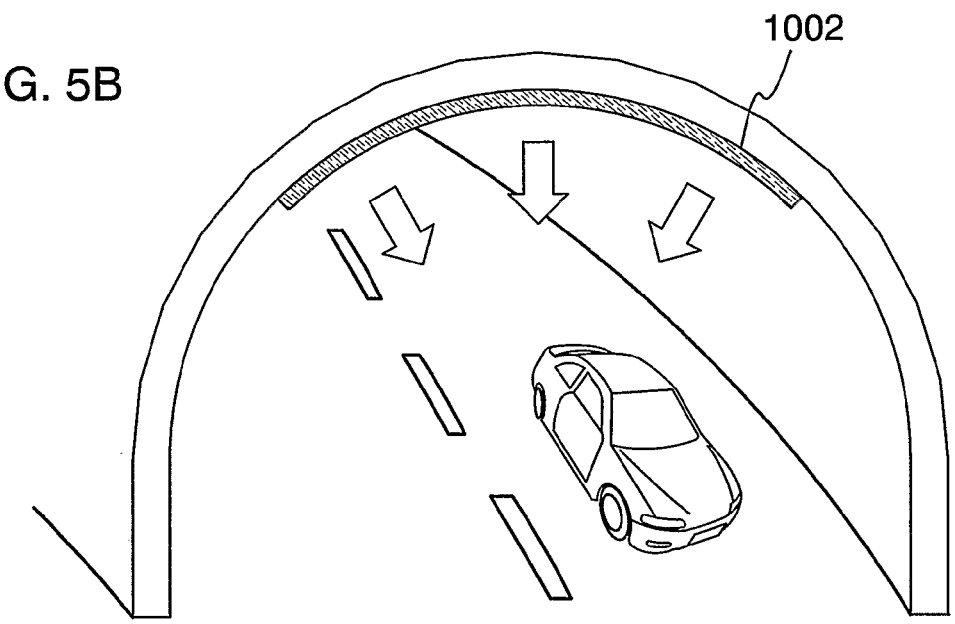

FIG. 5B shows a lighting system according to the present invention used as lighting in a tunnel 1002. Since the lighting system according to the present invention has high color rendering properties, objects can be seen in the tunnel as in natural light, and so the sense of discomfort can be prevented.

Figure 5C:
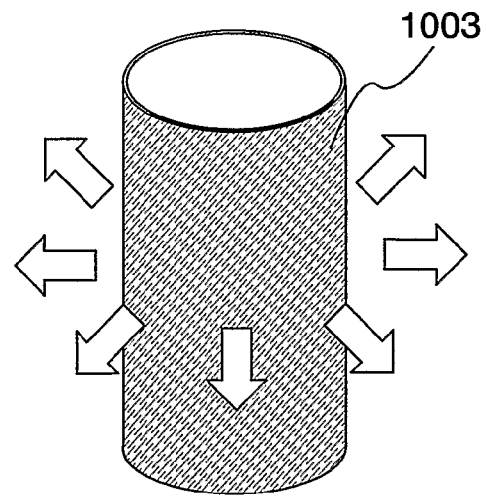

FIG. 5C shows an example of using the lighting system according to the present invention as lighting 1003 for interior accessories. The lighting system according to the present invention can be made to have flexibility by being manufactured over a flexible substrate and is a plane emission lighting system. Consequently, the lighting system can be freely processed into any shape as illustrated in FIG. 5B.

The lighting system according to the present invention has high color rendering properties, and so it is well preferably used as lighting for photography. When taking a photograph, a photograph as if by emitting natural light to subject can be taken by emitting light of a large area to the subject.

Embodiment 6

In consideration of temperature characteristics of an electroluminescent element and change in characteristics with time of luminance, a light-emitting device 413 which can emit light at constant luminance free from the changing factors is explained with reference to FIGS. 6 and 7 in this embodiment.

Figure 6:
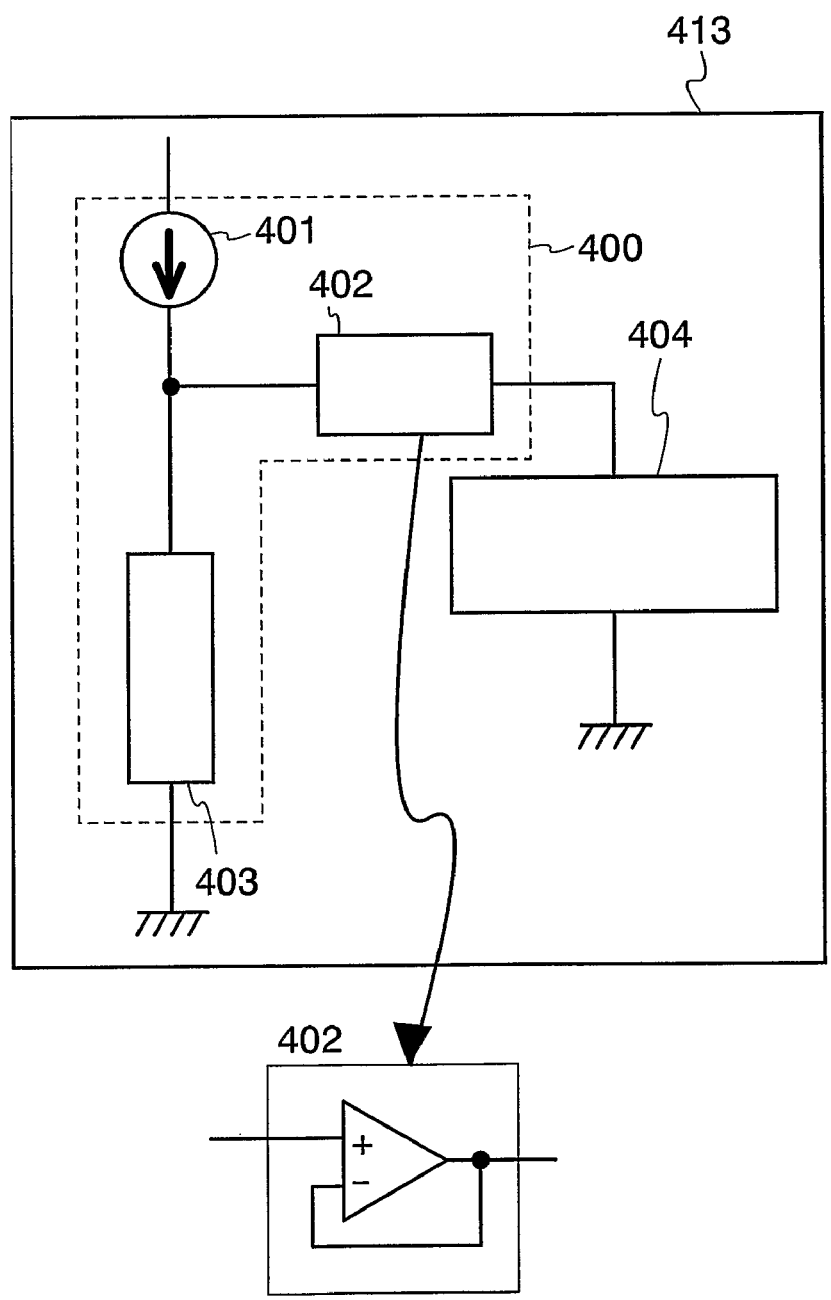
FIG. 6 is a view for showing an example of a circuit mounted to a light-emitting device according to the present invention (Embodiment 6)
Figure 7:
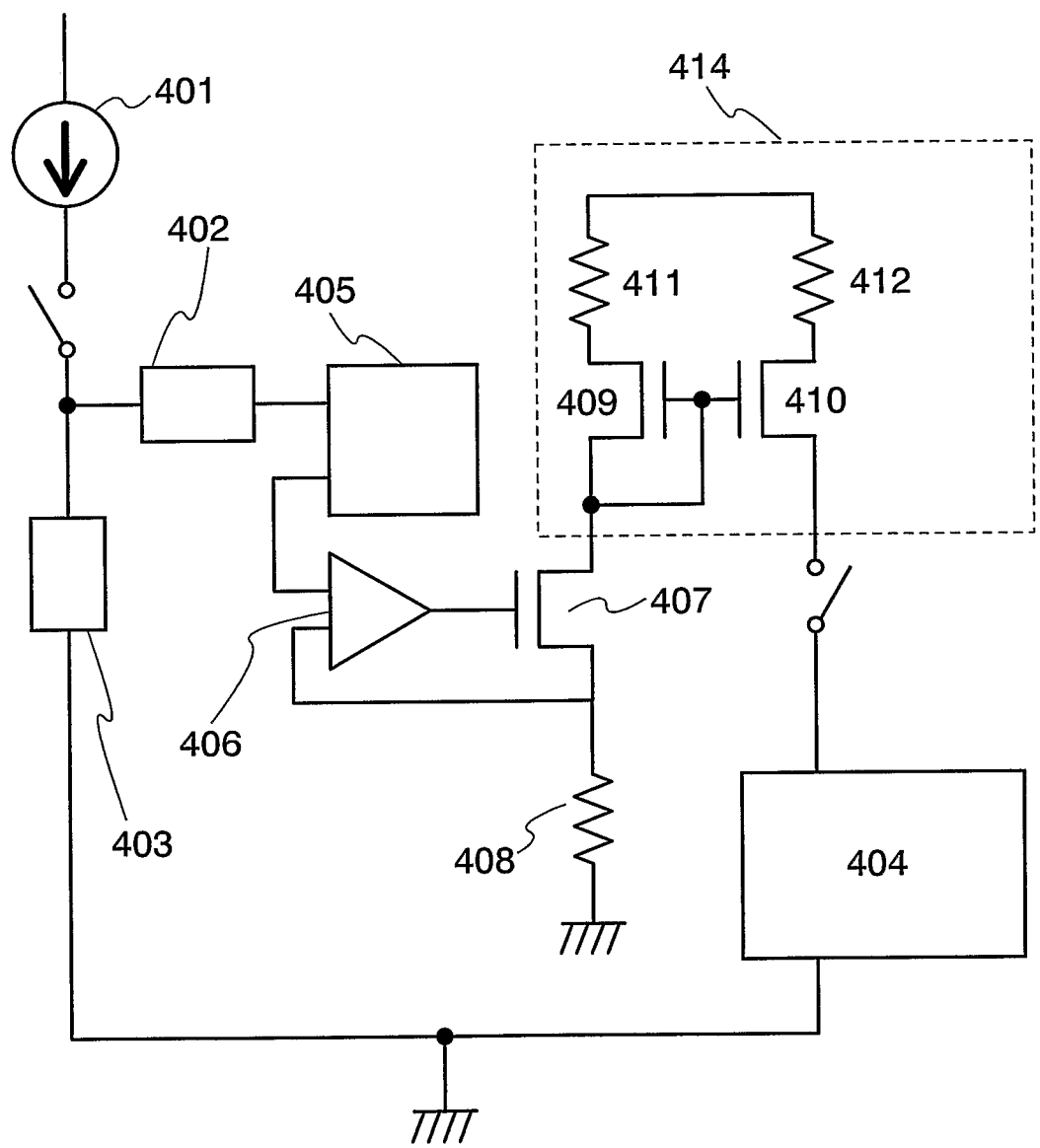
FIG. 7 is a view for showing an example of a circuit mounted to a light-emitting device according to the present invention (Embodiment 7)

In a light-emitting device illustrated in FIGS. 6 and 7, an electroluminescent element 404 has the same structure as described in Embodiment 1. Besides the electroluminescent element 404, a monitor element 403 is provided. One or more than one of the monitor element 403 can be provided. The monitor element 403 can be provided adjacent to the electroluminescent element 404 or provided outside the portion where the electroluminescent element 404 is provided.

The monitor element 403 and the electroluminescent element 404 are preferably manufactured by the same manufacturing process. That is, the structure and the material of these elements are the same. By manufacturing the monitor element 403 and the electroluminescent element 404 in such a way, they can be made to have similar temperature characteristics and characteristics in deterioration. As a result, accuracy of correction of luminance variation can be improved. The structures of the monitor element 403 and the electroluminescent element 404 are the same as those explained in Embodiment 1 in which two or more electroluminescent elements among a plurality of electroluminescent elements formed over one plane surface are connected to neighborhood or adjacent electroluminescent elements in series. The electrode structure of the monitor element 403 may be a typical laminate structure in which an organic thin film is interposed between a pair of electrodes without complicating the structure.

The monitor element 403 is connected to a current source 401. Either terminal of the monitor element 403 for connecting to the current source 401 is connected to an input side of a voltage generating circuit 402. An output side of the voltage generating circuit 402 is connected to the electroluminescent element 404.

The current source 401 supplies constant current to the monitor element 403. When environmental temperature is changed in the state that the monitor element 403 is driven at constant current, the resistance value is changed. When the resistance value is changed, potential difference between both electrodes of the monitor element 403 is changed since the value of current flown in the monitor element 403 is constant. By detecting the potential difference of the monitor element 403, change in environmental temperature can be detected. In the monitor element 403, potential of the other electrode which is not connected to the current source 401 is constant. Therefore, change in electrode potential of the side of the monitor element 403 connected to the current source 401 can be detected.

The resistance value of the monitor element 403 is changed also in the case that light emission characteristics of the monitor element 403 driven at constant current are changed with time. In that case, similarly, change in emission characteristics can be known by detecting potential difference of the monitor element 403. That is, the degree of deterioration of luminance can be detected.

The voltage generating circuit 402 uses either electrode potential of the monitor element 403 as input potential. The potential output from the voltage generating circuit 402 is the same as that detected by the monitor element 403. By the voltage generating circuit 402, either the electrode potential of the monitor element 403 can be reflected in the driver voltage of the electroluminescent element 404.

The voltage generating circuit 402 can be constructed by a voltage follower circuit using an operational amplifier as illustrated in an inserted view. Since a noninverted input terminal and an output terminal of the voltage follower circuit are high input impedance and low output impedance, respectively, output is conducted at the same potential of the input side and the output side, and current can be flown from the output terminal without flowing current of the current source 401 into the voltage follower circuit. Another circuit structure can be applied as long as the circuit can prevent potential variation like the illustrated voltage follower circuit.

The light-emitting device constructs temperature and deterioration compensation circuit (hereinafter, compensation circuit 400) by the current source 401, the monitor element 403, and the voltage generating circuit 402. That is, both of the electroluminescent element provided in a light-emitting portion and the monitor element equivalent to the electroluminescent element are operated under different driving conditions to control the ratio of the total amounts of charges flown in the electroluminescent element provided in the light-emitting portion and the monitor element so as to fulfill a definite relation in consideration of luminance deterioration.

The light-emitting device according to this embodiment corrects so that luminance of the electroluminescent element 404 is constant by comparing an amount of charges flown in the electroluminescent element 404 and an amount of charges flown in the monitor element 403 by considering essential deterioration of the electroluminescent element. Accordingly, constant luminescent driving which keeps the luminance of the electroluminescent element 404 constant can be realized. For example, the driving condition for the monitor element 403 is set to be overload compared to the driving condition for the electroluminescent element 404 to control the luminance to be constant; consequently, the constant luminescent driving can be realized.

An example of a light-emitting device which can emit light at constant luminance free from the changing factors in consideration of temperature characteristics of an electroluminescent element and change in characteristics with time of luminance is explained with reference to FIG. 7.

The light-emitting device shown in FIG. 7 has the monitor element 403 and the electroluminescent element 404. The monitor element 403 is driven at constant current by the current source 401. The constant voltage source 405 has a function of producing constant voltage by using a constant voltage source having small temperature coefficient such as a known band gap regulator. Voltage produced from the constant voltage source 405 is converted into constant current having small temperature coefficient by an operation amplifier 406, a transistor 407, and a resistance 408. The converted current is inverted by a current mirror circuit 414 constructed by a transistor 409, a transistor 410, a resistance 411, and a resistance 412, and supplied to the electroluminescent element 404. The voltage produced from the constant voltage source 405 is controlled according to the output of the voltage generating circuit 402 which detects potential difference of the monitor element 403. In that case, the light-emitting device operates so that output voltage of the constant current source 405 rises and an amount of current flown in the electroluminescent element 404 is increased when the output voltage of the voltage generating circuit 402 becomes high.

The light-emitting device in FIG. 7 can prevent change in luminance due to both of temperature change and change with time by correcting voltage produced from a constant voltage source 405 according to the temperature change and the change with time.

As noted above, combining a means for correcting luminance of an electroluminescent element according to temperature characteristics of an electroluminescent element and change with time can prevent a burden on eyes due to lowering illumination intensity. Accordingly, lighting which can achieve consistently optimal brightness can be obtained.

Embodiment 7

Figure 10A:
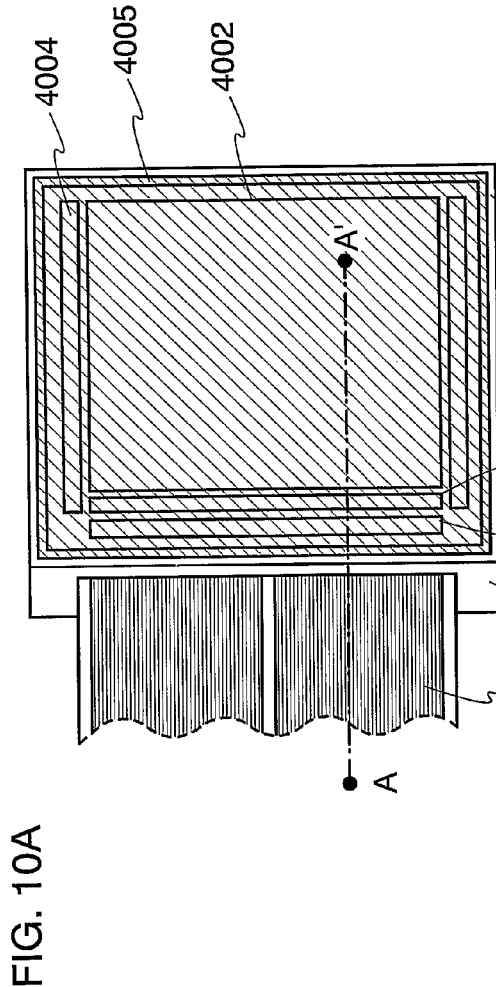
FIGS. 10A and 10B are an example of a light-emitting device according to the present invention (Embodiment 7).
Figure 10B:
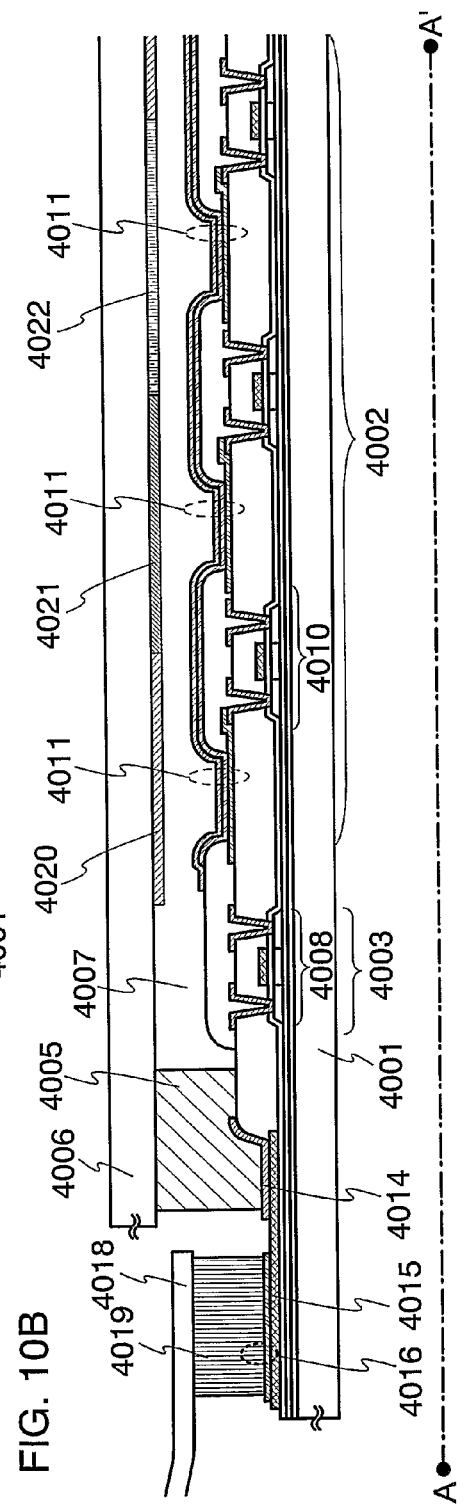

A light-emitting device which corresponds to one embodiment according to the present invention is explained with reference to FIGS. 10A and 10B in this embodiment. FIG. 10A illustrates a top view of a panel in which a transistor and a light-emitting element, each of which is formed over a substrate, are sealed with a sealing agent between the substrate and an opposing substrate 4006. FIG. 10B is a cross-sectional view of FIG. 10A. The structure of a light-emitting element 4011 in the panel has any one of structures described in Embodiments 1 to 3.

A sealing agent 4005 is provided so as to surround a pixel portion 4002, a signal line driver circuit 4003, and a scanning line driver circuit 4004, each of which is provided over a substrate 4001. Further, the opposing substrate 4006 is provided over the pixel portion 4002, the signal line driver circuit 4003, and the scanning line driver circuit 4004. Accordingly, the pixel portion 4002, the signal line driver circuit 4003, and the scanning line driver circuit 4004 are sealed together with a filling agent 4007 with the substrate 4001, the sealing agent 4005, and the opposing substrate 4006.

Each the pixel portion 4002, the signal line driver circuit 4003, and the scanning line driver circuit 4004 has a plurality of thin film transistors. FIG. 10B illustrates a thin film transistor 4008 included in the signal line driver circuit 4003 and a thin film transistor 4010 included in the pixel portion 4002.

The thin film transistor 4011 is electrically connected to the thin film transistor 4010. The thin film transistor 4010 is supplied with a signal from a driver. Accordingly, an image can be displayed on the light-emitting device by controlling ON or OFF of the light-emitting element 4011.

It is possible that color filters 4020 to 4022 corresponding to red, blue, and green are provided to the opposing substrate 4006 to realize full color display by emitting light through the color filters. Light emitted from the light-emitting element 4011 included in the light-emitting device according to this embodiment has a broad spectrum, and so any color filter can be used irrespective of its transmission wavelengths.

A method for manufacturing a thin film transistor is not restricted. A known method can be used for manufacturing the thin film transistor.

A lead wiring 4014 corresponds to a wiring for supplying a signal or power source voltage to the pixel portion 4002, the signal driver circuit 4003, and the scanning line driver circuit 4004. The lead wiring 4014 is connected to a connecting terminal 4016 via a lead wiring 4015. The connecting terminal 4016 is electrically connected to a terminal included in a flexible printed circuit (FPC) 4018 via an anisotropic conductive film 4019.

As the filling agent 4007, ultraviolet curing resin, thermal curing resin, polyvinylchloride, acrylic, polyimide, epoxy resin, silicon resin, polyvinyl butylal, or ethylene vinylene acetate can be used besides inert gas such as nitrogen or argon.

The display device according to the present invention includes a panel provided with a pixel portion having a light-emitting element and a module in which an IC is mounted on the panel.

EXAMPLE

Synthesis Examples

Following examples show a synthesis of 2-(4-(pyrene-1-yl)phenyl)-3-(4-(pyrene-3-yl)phenyl)quinoxaline (abbreviated as PPQ) represented by a foregoing structural formula (2).

Step 1: Synthesis of 2,3-bis(4-bromophenyl)quinoxaline 1,2-phenylenediamine (6.8 g) and 1,2-bis-(4-bromo-phenyl)-ethane-1,2-dione (22.1 g) were dissolved in 350 ml of chloroform and heated to reflux for three hours. The reaction solution was washed with 1N-hydrochloric acid, water, and a saturated aqueous solution of sodium chloride and dried with magnesium sulfate. Then the reaction was concentrated under reduced pressure to give 24.4 g of 2,3-bis(4-bromophenyl) quinoxaline as a white solid. The synthesis scheme and the structural formula are shown in a following formula (15).

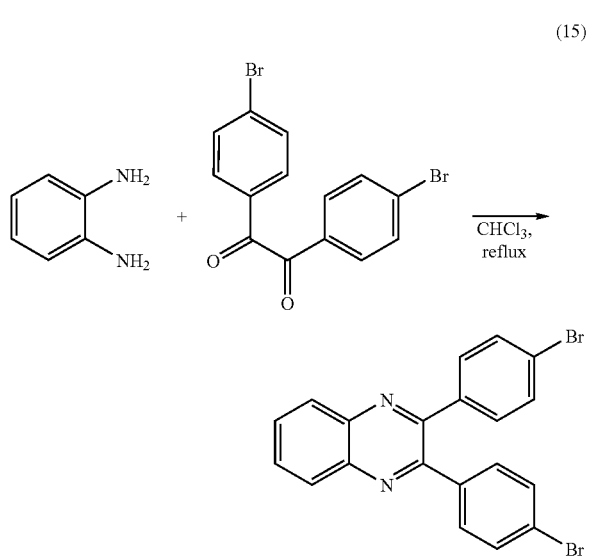

(15)

Step 2: Synthesis of 2,3-bis(4-dihydroxyborylphenyl)quinoxaline

In an atmosphere of nitrogen, 2,3-bis(4-bromophenyl)quinoxaline (15.8 g) obtained according to the procedure of the foregoing step 1 was dissolved in 180 ml of dried tetrahydrofuran (THF) and was cooled to –78° C. To the cooled solution, 50 ml of normal butyllithiumhexane solution (1.6 M) was gradually delivered by drops at –78° C. After delivering completely, the solution was stirred for three hours at –60° C. Then, the solution was cooled to –78° C. again, added with 20 ml of isopropyl borate, and stirred for an hour at –78° C. overnight at room temperature. Thereafter, the container charged with the solution was cooled with ice, added with 350 ml of 2N-hydrochloric acid dropwise to the solution, and stirred for an hour. After precipitates were collected by suction and filtration, the product was dried under reduced pressure to give 12.5 g of 2,3-bis(4-dihydroxyborylphenyl)quinoxaline as an orange solid. Synthesis scheme and structural formula are shown in a following formula (16).

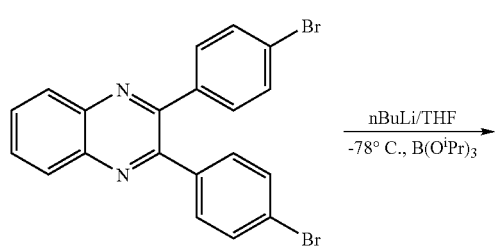

(16)

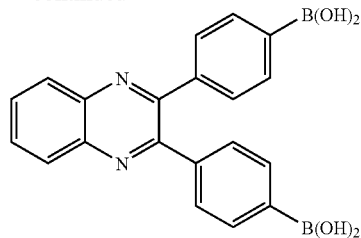

Step 3: Synthesis of 2-(4-(pyrene-1-yl)phenyl)-3-(4-(pyrene-3-yl)phenyl)quinoxaline (abbreviated as PPQ) Used in the Present Invention In an atmosphere of nitrogen, 2,3-bis(4-dihydroxyborylphenyl)quinoxaline (5.0 g) synthesized according to the procedure of the foregoing step 2, 1-bromopyrene (8.4 g), tri(o-tolyl)phosphine (0.64 g), and palladium acetate (67.0 mg) were dissolved to 50 ml of dimethoxyethane. The aqueous solution of potassium carbonate (12.4 g, pure water 50 ml) was added to the solution, stirred at 10 minutes at room temperature, and was heated to reflux for 12 hours at 80° C. The reaction mixture was extracted with ethyl acetate, washed with water and a saturated aqueous solution of sodium chloride, and dried with magnesium sulfate. The solvent was concentrated under reduced pressure to give yellow solid product of 4.8 g. The obtained product was purified by sublimation to give PPQ. The synthesis scheme and the structural formula are shown in a following formula (17).

(17)

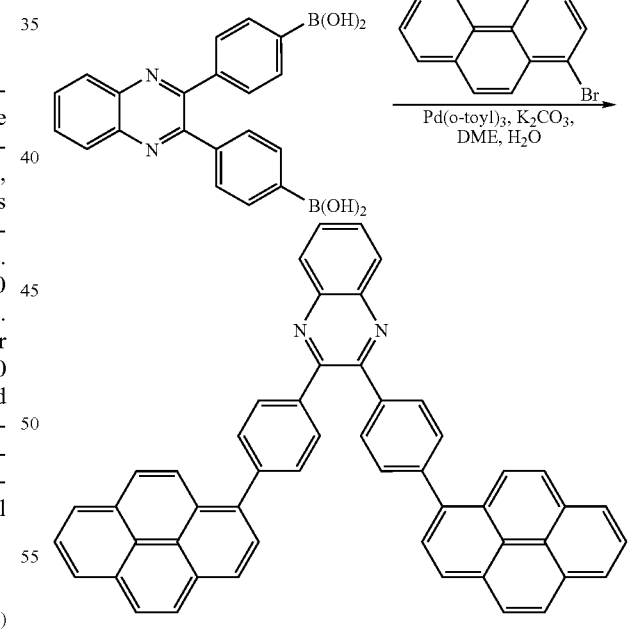

Figure 8:
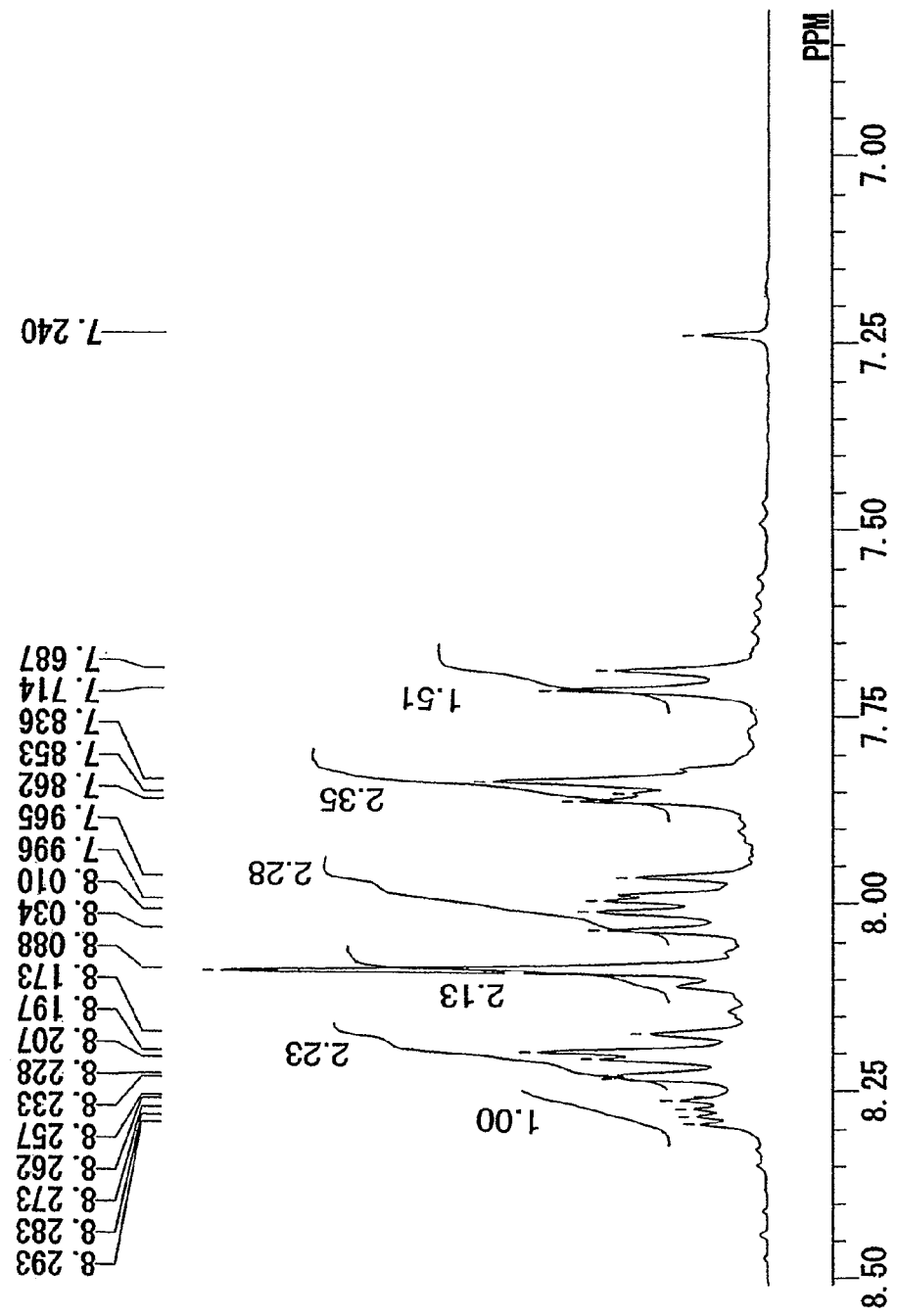
FIG. 8 is an NMR measurement result of a light-emitting material (PPQ) used for forming a light-emitting element according to the present invention.

FIG. 8 shows results of analysis of nuclear magnetic resonance spectrometry of the PPQ, the quinoxaline derivative.

Figure 9:
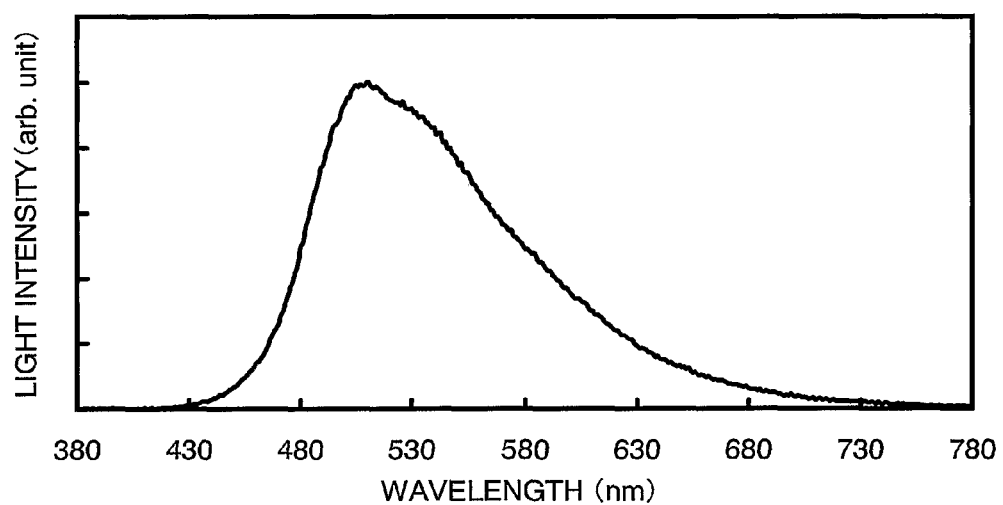
FIG. 9 is an emission spectrum of a light-emitting material (PPQ) used for forming a light-emitting element according to the present invention.

FIG. 9 shows an emission spectrum of a light-emitting element formed by using only the PPQ as an emission center.

The light-emitting element is formed according to the following procedure, that is, ITO is deposited as an anode over a substrate having an insulating property by a sputtering method, DNTPD which is a hole injecting material is deposited to have a thickness of 50 nm by a vapor deposition method, TPD which is a hole transporting material is deposited to have a thickness of 10 nm by a vapor deposition method, the PPQ is deposited as a light-emitting layer to have a thickness of 40 nm by a vapor deposition method, Alq which is an electron transporting material is deposited to have a thickness of 20 nm by a vapor deposition method, CaF which is an electron injecting material is deposited to have a thickness of 1 nm by a vapor deposition method, and Al is deposited as a cathode to have a thickness of 150 nm by a vapor deposition method, sequentially.

As shown in FIG. 9, light emission of the PPQ has a broad emission spectrum at from 425 to 725 nm with a maximum around 500 nm. Accordingly, the PPQ is an extreme favorable material for forming a light-emitting element, a light-emitting device, and a lighting system, each of which has excellent color rendering properties. Accordingly, a white light-emitting element, a light-emitting device, and a lighting system, each of which uses the PPQ as a part of an emission center, can be manufactured to have excellent color rendering properties.

EXPLANATION OF REFERENCES

100: substrate, 101: first electrode, 102: first carrier injecting layer, 103: carrier transporting layer, 104: first light-emitting layer, 105: second light-emitting layer, 106: second carrier transporting layer, 107: second carrier injecting layer, 108: second electrode, 109: separation layer, 110: laminated body, 111: sealing material, 112: external connection, 113: opposed substrate, 114: wiring, 120: third carrier transporting layer, 121: carrier generating layer, 122: fourth carrier transporting layer, 400: compensation circuit, 401: current source, 402: voltage generating circuit, 403: monitor element, 404: electroluminescent element, 405: constant voltage source, 406: operation amplifier, 407: transistor, 408: resistance, 409: transistor, 410: transistor, 411: resistance, 412: resistance, 413: light-emitting device, 414: current mirror circuit, 1001: lighting, 1002: lighting, 1003: lighting, 4001: substrate, 4002: pixel portion, 4003: signal line driver circuit, 4004: scanning line driver circuit, 4005: sealing material, 4006: opposed substrate, 4007: filling agent, 4008: thin film transistor, 4010: thin film transistor, 4011: light-emitting element, 4014: wiring, 4015: wiring, 4016: connecting terminal, 4018: flexible printed circuit (FPC), 4019: anisotropic conductive film, 4020: color filter, 4021: color filter, 4022: color filter.

The invention claimed is:

1. A light-emitting device comprising:
a pair of substrates; and
a light-emitting element between the pair of substrates,
wherein the light-emitting element comprises:
   an anode;
   a mixed layer comprising a conductive inorganic compound and an aromatic amine compound over the anode;
   a first light emitting layer comprising a first luminescent material over the mixed layer;
   a carrier generating layer over the first light emitting layer;
   a second light emitting layer over the carrier generating layer, the second light emitting layer comprising a second luminescent material; and
   a cathode over the second light emitting layer,
wherein the carrier generating layer comprises a first film over the first light emitting layer and a second film over the first film,
wherein the first film comprises tris(8-quinolinolato)aluminum and lithium,
wherein the second film comprises 4,4'-bis[N-(1-napthyl)-N-phenyl-amino]biphenyl and molybdenum oxide, and
wherein the second luminescent material is a quinoxaline derivative represented by the following general formula (1):

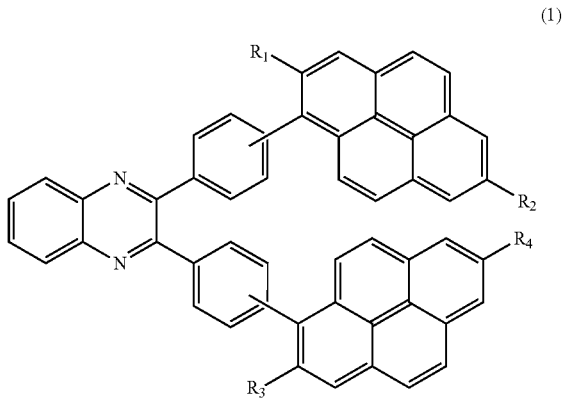

wherein R1 to R4 are hydrogen or an alkyl group having 4 carbon atoms comprising a straight-chain structure or a branch structure.

2. A light-emitting device comprising:
a pair of substrates; and
a light-emitting element between the pair of substrates,
wherein the light-emitting element comprises:
   an anode;
   a mixed layer comprising a conductive inorganic compound and an aromatic amine compound over the anode;
   a first light emitting layer comprising a first luminescent material over the mixed layer;
   a carrier generating layer over the first light emitting layer;
   a second light emitting layer over the carrier generating layer, the second light emitting layer comprising a second luminescent material; and
   a cathode over the second light emitting layer,
wherein the carrier generating layer comprises a first film over the first light emitting layer and a second film over the first film,
wherein the first film comprises tris(8-quinolinolato)aluminum and lithium,
wherein the second film comprises 4,4'-bis[N-(1-napthyl)-N-phenyl-amino]biphenyl and molybdenum oxide, and
wherein the second luminescent material is a quinoxaline derivative represented by the following formula (2):

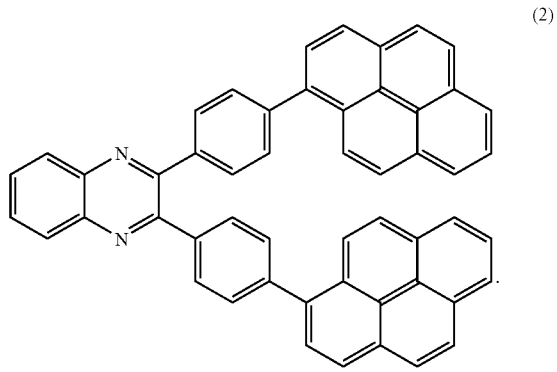

3. A light-emitting device comprising:
a pair of substrates; and
a light-emitting element between the pair of substrates,
wherein the light-emitting element comprises:
an anode;
a mixed layer comprising a conductive inorganic compound and an aromatic amine compound over the anode;
a first light emitting layer comprising a first luminescent material over the mixed layer;
a carrier generating layer over the first light emitting layer;
a second light emitting layer over the carrier generating layer, the second light emitting layer comprising a second luminescent material; and
a cathode over the second light emitting layer,
wherein the carrier generating layer comprises a first film over the first light emitting layer and a second film over the first film,
wherein the first film comprises tris(8-quinolinolato)aluminum and lithium,
wherein the second film comprises 4,4'-bis[N-(1-napthyl)-N-phenyl-amino]biphenyl and molybdenum oxide, and
wherein the second luminescent material is a quinoxaline derivative represented by the following formula (3):

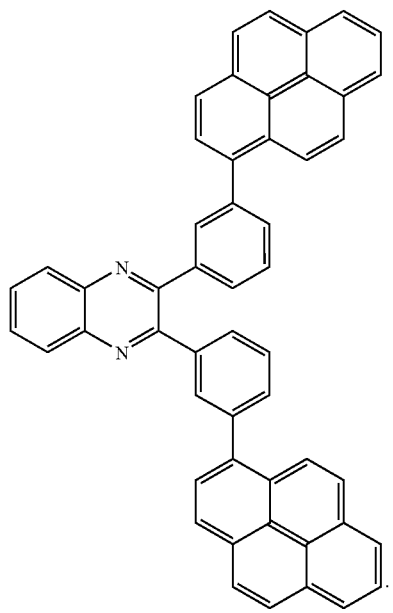

(3)

4. A light-emitting device comprising:
a pair of substrates; and
a light-emitting element between the pair of substrates,
wherein the light-emitting element comprises:
an anode;
a mixed layer comprising a conductive inorganic compound and an aromatic amine compound over the anode;
a first light emitting layer comprising a first luminescent material over the mixed layer;
a carrier generating layer over the first light emitting layer;
a second light emitting layer over the carrier generating layer, the second light emitting layer comprising a second luminescent material; and
a cathode over the second light emitting layer,
wherein the carrier generating layer comprises a first film over the first light emitting layer and a second film over the first film,
wherein the first film comprises tris(8-quinolinolato)aluminum and lithium,
wherein the second film comprises 4,4'-bis[N-(1-napthyl)-N-phenyl-amino]biphenyl and molybdenum oxide, and
wherein the second luminescent material is a quinoxaline derivative represented by the following formula (4):

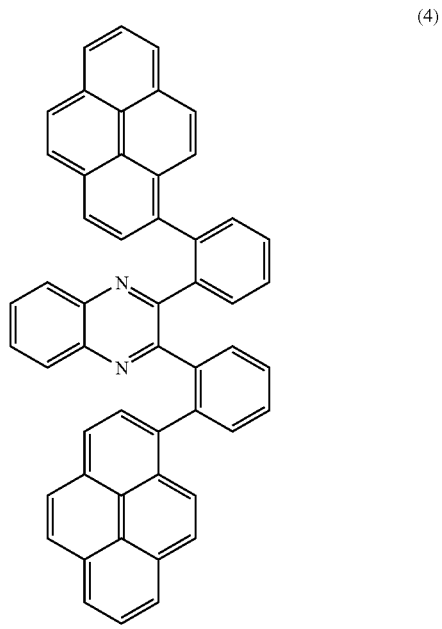

(4)

5. A light-emitting device comprising:
a pair of substrates; and
a light-emitting element between the pair of substrates,
wherein the light-emitting element comprises:
an anode;
a mixed layer comprising a conductive inorganic compound and an aromatic amine compound over the anode;
a first light emitting layer comprising a first luminescent material over the mixed layer;
a carrier generating layer over the first light emitting layer;
a second light emitting layer over the carrier generating layer, the second light emitting layer comprising a second luminescent material; and
a cathode over the second light emitting layer,
wherein the carrier generating layer comprises a first film over the first light emitting layer and a second film over the first film,
wherein the first film comprises tris(8-quinolinolato)aluminum and lithium,
wherein the second film comprises 4,4'-bis[N-(1-napthyl)-N-phenyl-amino]biphenyl and molybdenum oxide, and wherein the second luminescent material is a quinoxaline derivative represented by the following formula (5):

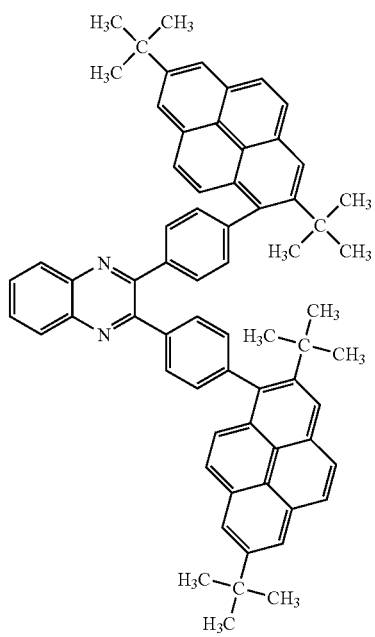

(5)

wherein the second luminescent material is a quinoxaline derivative represented by the following formula (6):

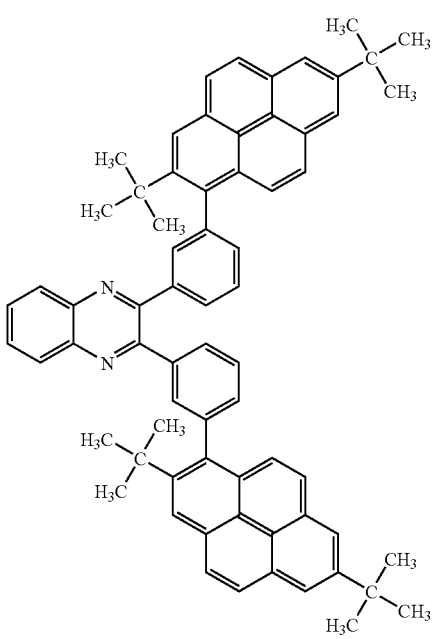

(6)

6. A light-emitting device comprising:
a pair of substrates; and
a light-emitting element between the pair of substrates,
wherein the light-emitting element comprises:
　an anode;
　a mixed layer comprising a conductive inorganic compound and an aromatic amine compound over the anode;
　a first light emitting layer comprising a first luminescent material over the mixed layer;
　a carrier generating layer over the first light emitting layer;
　a second light emitting layer over the carrier generating layer, the second light emitting layer comprising a second luminescent material; and
　a cathode over the second light emitting layer,
wherein the carrier generating layer comprises a first film over the first light emitting layer and a second film over the first film,
wherein the first film comprises tris(8-quinolinolato)aluminum and lithium,
wherein the second film comprises 4,4'-bis[N-(1-napthyl)-N-phenyl-amino]biphenyl and molybdenum oxide, and 7. A light-emitting device comprising:
a pair of substrates; and
a light-emitting element between the pair of substrates,
wherein the light-emitting element comprises:
　an anode;
　a mixed layer comprising a conductive inorganic compound and an aromatic amine compound over the anode;
　a first light emitting layer over the mixed layer, the first light emitting layer comprising a first luminescent material;
　a carrier generating layer over the first light emitting layer;
　a second light emitting layer over the carrier generating layer, the second light emitting layer comprising a second luminescent material; and
　a cathode over the second light emitting layer,
wherein the carrier generating layer comprises a first film over the first light emitting layer and a second film over the first film,
wherein the first film comprises tris(8-quinolinolato)aluminum and lithium,
wherein the second film comprises 4,4'-bis[N-(1-napthyl)-N-phenyl-amino]biphenyl and molybdenum oxide, and wherein the second luminescent material is a quinoxaline derivative represented by the following formula (7):

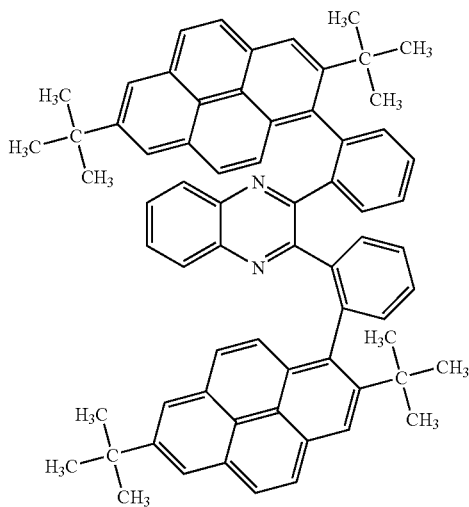

(7)

8. The light-emitting device according to any one of claims 1 to 7, wherein the first luminescent material emits a red light.

9. The light-emitting device according to any one of claims 1 to 7, wherein the first luminescent material has a peak at 580 to 750 nm in an emission spectrum.

10. The light-emitting device according to any one of claims 1 to 7, wherein the light-emitting device is incorporated in a lighting system.

11. The light-emitting device according to any one of claims 1 to 7, wherein the conductive inorganic compound comprises a metal oxide.

12. The light-emitting device according to any one of claims 1 to 7, wherein the conductive inorganic compound comprises molybdenum oxide.

13. The light-emitting device according to any one of claims 1 to 7, wherein the conductive inorganic compound comprises vanadium oxide.

14. A lighting device comprising a light-emitting device according to claim 1.

15. A lighting device comprising a light-emitting device according to claim 2.

16. A lighting device comprising a light-emitting device according to claim 3.

17. A lighting device comprising a light-emitting device according to claim 4.

18. A lighting device comprising a light-emitting device according to claim 5.

19. A lighting device comprising a light-emitting device according to claim 6.

20. A lighting device comprising a light-emitting device according to claim 7.

* * * * *